United States Patent
Inoue et al.

(10) Patent No.: US 9,069,212 B2
(45) Date of Patent: Jun. 30, 2015

(54) EXPOSURE APPARATUS, LIQUID CRYSTAL DISPLAY DEVICE, AND METHOD FOR MANUFACTURING LIQUID CRYSTAL DISPLAY DEVICE

(75) Inventors: Iichiro Inoue, Osaka (JP); Koichi Miyachi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 132 days.

(21) Appl. No.: 13/574,893

(22) PCT Filed: Oct. 29, 2010

(86) PCT No.: PCT/JP2010/069338
§ 371 (c)(1),
(2), (4) Date: Jul. 24, 2012

(87) PCT Pub. No.: WO2011/089772
PCT Pub. Date: Jul. 28, 2011

(65) Prior Publication Data
US 2012/0293763 A1    Nov. 22, 2012

(30) Foreign Application Priority Data
Jan. 25, 2010    (JP) ................................ 2010-013453

(51) Int. Cl.
G02F 1/1337    (2006.01)
G03F 1/50    (2012.01)
G02F 1/13    (2006.01)

(52) U.S. Cl.
CPC ........ *G02F 1/133788* (2013.01); *G02F 1/1303* (2013.01); *G03F 1/50* (2013.01)

(58) Field of Classification Search
CPC ............................ G02F 1/133788; G03F 1/50
USPC .......................................... 349/178, 123, 187
See application file for complete search history.

(56) References Cited

U.S. PATENT DOCUMENTS 6,867,836 B2 *   3/2005   Stalder et al. ................. 349/129
7,872,718 B2 *   1/2011   Inoue et al. ................... 349/129
(Continued)

FOREIGN PATENT DOCUMENTS

CN    101622572 A    1/2010
JP    6-324474    11/1994
(Continued)

OTHER PUBLICATIONS

International Search Report for PCT/JP2010/069338 mailed Feb. 1, 2011.
(Continued)

*Primary Examiner* — Sang V Nguyen
(74) *Attorney, Agent, or Firm* — Nixon & Vanderhye P.C.

(57) ABSTRACT

This invention is an exposure apparatus for exposing a photoalignment film provided on a substrate. The exposure apparatus includes a light source and a photomask, and exposes the photoalignment film through the photomask while scanning the light source or the substrate. When a direction in which the light source or the substrate is scanned is taken as a scanning direction, and a direction that is orthogonal to the scanning direction is taken as a vertical direction, the photomask includes a first region and a second region that is adjacent to the first region in the vertical direction. The first region includes a plurality of first transparent portions inside a first light-shielding portion. The plurality of first transparent portions are arranged in the vertical direction. The second region includes a plurality of second transparent portions inside a second light-shielding portion.

26 Claims, 21 Drawing Sheets

(56) References Cited

U.S. PATENT DOCUMENTS

| | | | |
|---|---|---|---|
| 2008/0299690 A1* | 12/2008 | Hirota | 438/30 |
| 2010/0085524 A1* | 4/2010 | Nakagawa | 349/124 |
| 2010/0225864 A1 | 9/2010 | Inoue et al. | |
| 2010/0315611 A1* | 12/2010 | Kato | 355/55 |
| 2011/0037686 A1 | 2/2011 | Inoue et al. | |
| 2011/0045410 A1 | 2/2011 | Inoue et al. | |
| 2011/0134380 A1 | 6/2011 | Inoue et al. | |
| 2011/0229825 A1 | 9/2011 | Inoue et al. | |
| 2011/0310338 A1 | 12/2011 | Inoue et al. | |
| 2011/0311918 A1 | 12/2011 | Inoue et al. | |
| 2013/0271742 A1* | 10/2013 | Mizumura | 355/71 |

FOREIGN PATENT DOCUMENTS

| | | | |
|---|---|---|---|
| JP | 06-324474 | * 11/1994 | G03F 1/08 |
| JP | 2000-66235 | 3/2000 | |
| JP | 2001-281669 | 10/2001 | |
| JP | 2009-80312 | 4/2009 | |
| WO | WO 2007/086474 | 8/2007 | |

OTHER PUBLICATIONS

M. Kimura et al., "Photo-Rubbing Method: A Single-Exposure Method to Stable Liquid-Crystal Pretilt Angle on Photo-Alignment Films", IDW ' 04 Publication Committee, 2004, LCT2-1, pp. 35-38.

* cited by examiner

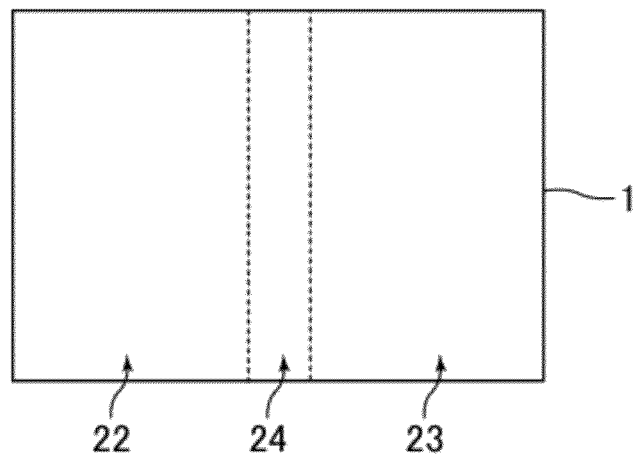
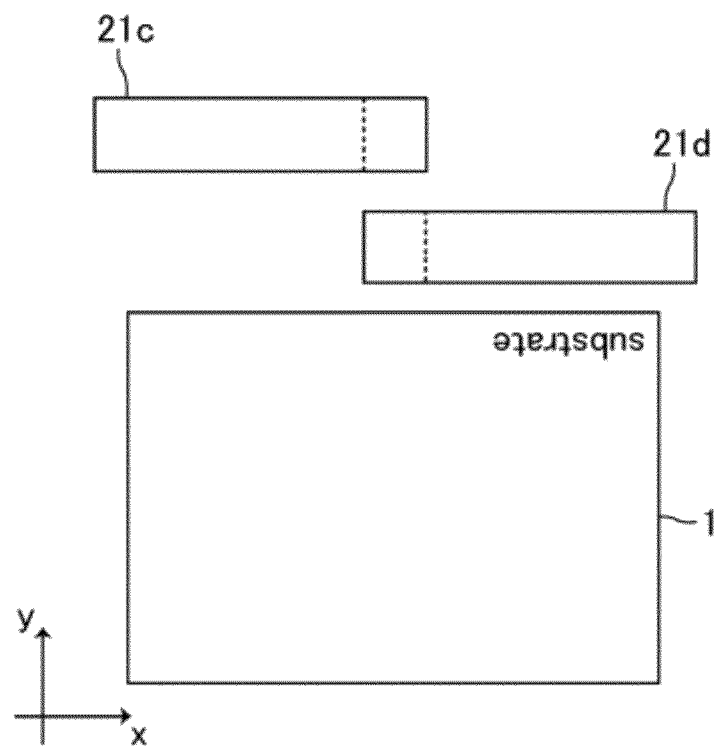

Scanning direction

EXPOSURE APPARATUS, LIQUID CRYSTAL DISPLAY DEVICE, AND METHOD FOR MANUFACTURING LIQUID CRYSTAL DISPLAY DEVICE

This application is the U.S. national phase of International Application No. PCT/JP2010/069338 filed 29 Oct. 2010 which designated the U.S. and claims priority to JP 2010-013453 filed 25 Jan. 2010, the entire contents of each of which are hereby incorporated by reference.

TECHNICAL FIELD

The present invention relates to an exposure apparatus, a liquid crystal display device, and a method for manufacturing the liquid crystal display device. More particularly, the present invention relates to an exposure apparatus that is favorably used in an aligning treatment of a photoalignment film, a liquid crystal display device including a photoalignment film, and a method for manufacturing the liquid crystal display device.

BACKGROUND ART

Because liquid crystal display devices are display devices that enable weight reduction, thinning, and lower power consumption, liquid crystal display devices are widely utilized for televisions, monitors for personal computers, monitors for portable terminals and the like. In such liquid crystal display devices, normally the transmittance of light that passes through a liquid crystal layer is controlled by a tilt angle of liquid crystal molecules that changes depending on a voltage that is applied between a pair of substrates (to the liquid crystal layer). Consequently, in such liquid crystal display devices, the transmittance depends on a viewing angle. As a result, in conventional liquid crystal display devices, depending on the viewing (observation) angle, display defects sometimes occur such as a decrease in the contrast ratio or gray scale inversion when a gradation display is performed. Accordingly, such conventional liquid crystal display devices generally have room for improvement with respect to viewing angle characteristics.

Domain division technology has been developed in which each pixel is divided into two or more regions in which the tilt directions of liquid crystal molecules are different. According to this technology, when a voltage is applied to a liquid crystal layer, because liquid crystal molecules tilt in different directions inside the pixels, the viewing angle characteristics can be improved. In this connection, the respective regions in which the alignment directions of the liquid crystal molecules are different are also referred to as "domains", and domain division is also referred to as "multi-domain".

Examples of liquid crystal modes in which domain division is performed include, with respect to horizontal alignment modes, multi-domain twisted nematic (TN) mode, multi-domain electrically controlled birefringence (ECB) mode, and multi-domain optically compensated birefringence (OCB) mode. In addition, examples of vertical alignment modes in which domain division is performed include multi-domain vertical alignment (MVA) mode, patterned vertical alignment (PVA) mode, and multi-domain VAECB (vertical alignment ECB) mode. Various modifications are being developed to realize even wider viewing angles with respect to the liquid crystal display devices of each mode.

Examples of methods of performing domain division include a rubbing method and a photoalignment method. As a rubbing method, a method has been proposed that performs a rubbing treatment with respect to an alignment film in a state in which a rubbing region and a non-rubbing region are separated from each other by a resist in which a pattern has been formed. However, in the rubbing method, an aligning treatment is performed by rubbing a vertical alignment surface with a cloth that is wound on a roller. Therefore, when the rubbing method is employed, foreign matter such as fiber of the cloth and scraped off pieces are generated, and defects such as damage, a characteristic shift, or deterioration in switching elements may arise due to static electricity. Hence, there is further room for improvement with respect to the rubbing method.

On the other hand, in the photoalignment method, a photoalignment film is used as an alignment film, and by irradiating (exposing) the photoalignment film with light such as ultraviolet light, an alignment regulating force is generated in the alignment film and/or an alignment regulating direction of the alignment film is changed. Thus, in the photoalignment method, aligning treatment of an alignment film can be performed in a contactless manner, and generation of dirt or foreign matter and the like during the aligning treatment can be suppressed. In addition, by using a photomask at the time of exposure, it is possible to irradiate light under different conditions in desired regions on the face of the alignment film. It is thus possible to easily form domains that have a desired design.

As examples of a conventional method of domain division using the photoalignment method, the following methods may be mentioned for a case where, for example, pixels are divided into two domains. More specifically, a method may be mentioned in which a photomask is prepared in which slit-shaped transparent portions that have a width that is equal to approximately half of a pixel pitch are formed in a light-shielding region, a first exposure is performed with respect to a half of the entire region of the pixel, and thereafter the photomask is shifted by an amount corresponding to approximately half of the pitch and a second exposure is performed under different conditions to the first exposure with respect to the remaining region of the pixel. According to such a method, each pixel can be easily divided into two or more domains. Furthermore, for example, Patent Literature 1 discloses technology that performs aligning treatment by a photoalignment method to form a VAECB (vertical alignment ECB) mode.

Further, the sizes of liquid crystal display device have been increasing in recent years. Manufacture and sales of liquid crystal television models has been increasing rapidly with respect to markets for model sizes in which plasma televisions have conventionally accounted for the major share of the market, such as the market for model sizes from 40 to 60 inches. However, it has been extremely difficult to perform domain division by a conventional photoalignment method such as the method described above with respect to a large liquid crystal display device in the 60 inch class. This is because an exposure apparatus that can complete exposure of a substrate in the 60 inch class through a single exposure and that is of a size that can be installed inside a factory does not actually exist at the present time, and hence it is not possible to expose the entire surface of a substrate in the 60 inch class through a single exposure. Consequently, when subjecting a large liquid crystal display device to domain division by a photoalignment method, it has been necessary to perform exposure several times to expose the entire surface of the substrate. In addition, even when a relatively small liquid crystal display device in the 20 inch class is subjected to domain division by a photoalignment method, a case can be considered in which it is required to complete exposure of the substrate by performing exposure several times when it is desired to keep the size of the exposure apparatus as small as possible. However, in a liquid crystal display device that has been subjected to domain division by exposing a substrate several times in the aforementioned manner, there are cases where a joint line between respective exposure regions can be clearly seen on the display screen, resulting in a defective product. Therefore, in the case of performing domain division of a liquid crystal display device by dividing the substrate into a plurality of regions and exposing the substrate through several exposures, there is still room for improvement with respect to improving the display quality and increasing the yield.

The inventors have developed the following method as technology for improving the above problems, and have already filed a patent application for this technology (see Patent Literature 2). That is, the method includes an exposure step of dividing the substrate face into two or more exposure regions and performing exposure of an alignment film through a photomask for each exposure region, wherein, in the exposure step, exposure is performed so that a part of adjacent exposure regions overlap with each other, and the photomask has a halftone portion that corresponds to the overlapping exposure regions.

CITATION LIST

Patent Literature

Patent Literature 1: JP 2001-281669A
Patent Literature 2: International Patent Publication No. WO 2007/086474

Non Patent Literature

Non Patent Literature 1: "Photo-Rubbing Method: A Single-Exposure Method to Stable Liquid-Crystal Pretilt Angle on Photo-Alignment Film", M. Kimura et al., IDW '04: proceedings of the 11th International Display Workshops, IDW '04 Publication committee, 2004, LCT 2-1, p. 35-38

SUMMARY OF INVENTION

Technical Problem

When the scanning exposure system according to the technology disclosed in Patent Literature 2 is adopted, no particular problem arises as long as the relevant substrate is normally moving at a constant speed. However, it has been newly found that in the event of the substrate stopping due to a momentary power interruption or the like, a defect occurs whereby the edge of a pattern formed in a photomask can be seen as display unevenness at an overlapping exposure region (joint portion).

Tests performed by the inventors will now be described in detail with reference to the drawings.

As shown in FIG. 32, a photomask 121 that is used in this case includes a center portion 119 and halftone portions 120. Striped-shaped transparent portions (stripe patterns) are formed in the center portion 119 and the halftone portions 120. The lengths of the transparent portions 128 of the halftone portions 120 gradually decrease with increasing distance from the center portion 119. The lengths of the transparent portions 128 decrease in the manner of a trigonometric function. Thus, the aperture ratio of the halftone portions 120 is less than the aperture ratio of the center portion 119. In this connection, the lengths of the transparent portions 128 may decrease in a linear manner with increasing distance from the center portion 119.

FIGS. 33 and 34 are schematic diagrams for describing a process of subjecting a photoalignment film that is formed on a substrate to a scanning exposure operation. As shown in FIGS. 33 and 34, because a substrate 118 is large, the photoalignment film is exposed using a plurality of photomasks 121. The substrate 118 is fixed on a stage 171. The entire photoalignment film provided on the substrate 118 is exposed by passing the substrate 118 and the stage 171 below a light source (not shown) and the photomasks 121 in a state in which the light source and the photomasks 121 are fixed. The substrate 118 is irradiated with UV light from a direction that is, for example, at an angle of 40° with respect to a normal direction to the substrate surface. The width of UV light that has passed through transparent portions 127 of the center portion 119 is, for example, 40 mm. Portions (joint portions 124) of the alignment film are exposed through the halftone portions 120 of two photomasks. As a result, when the substrate 118 is moving normally, each joint portion 124, i.e. a joint line, is not visually recognized. On the other hand, if the substrate 118 stands still due to a problem arising during scanning exposure, as shown in FIG. 35, display unevenness (mask trace 180) that corresponds to distal ends of the transparent portions 128 is visually recognized at the joint portions 124.

The inventors manufactured a panel using a substrate in which the above described problem had arisen, and after lighting the panel and examining the panel in detail, found that the appearance of a mask trace depends on the location. Specifically, as shown in FIG. 36, the mask trace 180 appears denser as the mask trace 180 approaches a center line 124c of the joint portion from ends 124a of the joint portion, and appears densest at the center line 124c. On the other hand, this phenomenon (mask trace) was not visually recognized in regions other than the joint portions 124, that is, in regions exposed through the center portion 119.

In the scanning exposure system, a light irradiation amount is set based on the length of a transparent portion (opening portion) of the photomask 121 and the moving speed of the substrate 118. More specifically, in the scanning exposure system, the amount of irradiation onto the photoalignment film is calculated based on the following equation.

(Irradiation amount)=(illuminance)×(transparent portion width)/(scanning speed)

Since the irradiation amount is set based on a value calculated by this equation, if the substrate 118 stands still, the scanning speed will become zero and the effective irradiation amount will momentarily rise. That is, the irradiation amount will be discontinuous between a time that the substrate 118 is moving and a time that the substrate 118 is standing still. This discontinuity in the irradiation amount directly influences the tilt angle of liquid crystal molecules. Further, it is considered that the degree of a momentary increase in the irradiation amount when the substrate stops differs between the joint portion 124 and areas other than the joint portion 124, and because the degree of increase is greater at the joint portion 124, a mask trace is visually recognized at the joint portion 124.

The present invention has been made in view of the above circumstances, and an object of the present invention is to provide an exposure apparatus that can inhibit visual recognition of display unevenness at a joint portion even if scanning temporarily stops during scanning exposure, as well as a liquid crystal display device and a method for manufacturing the liquid crystal display device.

Solution to Problem

The inventors conducted various studies regarding exposure apparatuses that can inhibit visual recognition of display unevenness at a joint portion even if scanning temporarily stops during scanning exposure, and focused attention on the patterns of photomasks. As a result, the inventors found that, by providing a first region and a second region that is adjacent to the first region in a direction (vertical direction) that is orthogonal to the scanning (scan) direction in the photomask, forming a plurality of first transparent portions inside a first light-shielding portion of the first region, arranging the plurality of first transparent portions in the vertical direction, forming a plurality of second transparent portions inside a second light-shielding portion of the second region, with the second transparent portions being made smaller than the first transparent portions, and arranging the plurality of second transparent portions in the vertical direction and also disposing the plurality of second transparent portions so as to be discretely dispersed in the scanning direction, even when a joint portion is exposed through the second region, the generation of a joint line can be suppressed. Furthermore, even if scanning temporarily stops during exposure, display unevenness that corresponds to the ends of the second transparent portions can be blurred and traces of the pattern of the second transparent portions can be made inconspicuous. Having realized that this idea can beautifully solve the above problem, the inventors have arrived at the present invention.

More specifically, the present invention provides an exposure apparatus for exposing a photoalignment film that is provided on a substrate, the exposure apparatus including a light source and a photomask, and exposing the photoalignment film through the photomask while scanning at least one of the light source and the substrate, wherein, when a direction in which at least one of the light source and the substrate is scanned is taken as a scanning direction, and a direction that is orthogonal to the scanning direction is taken as a vertical direction: the photomask has a first region, and a second region that is adjacent to the first region in the vertical direction; the first region has a plurality of first transparent portions inside a first light-shielding portion; the plurality of first transparent portions are arranged in the vertical direction; the second region has a plurality of second transparent portions inside a second light-shielding portion; the plurality of second transparent portions are smaller than the plurality of first transparent portions; and the plurality of second transparent portions are arranged in the vertical direction and are discretely dispersed in the scanning direction.

The configuration of the exposure apparatus of the present invention is not especially limited as long as it essentially includes such components.

The present invention further provides a method for manufacturing a liquid crystal display device that includes a photoalignment film that is provided on a substrate, the method for manufacturing including an exposure step of exposing the photoalignment film through a photomask while scanning at least one of a light source and the substrate, wherein, when a direction in which at least one of the light source and the substrate is scanned is taken as a scanning direction, and a direction that is orthogonal to the scanning direction is taken as a vertical direction: the photomask has a first region, and a second region that is adjacent to the first region in the vertical direction; the first region has a plurality of first transparent portions inside a first light-shielding portion; the plurality of first transparent portions are arranged in the vertical direction; the second region has a plurality of second transparent portions inside a second light-shielding portion; the plurality of second transparent portions are smaller than the plurality of first transparent portions; and the plurality of second transparent portions are arranged in the vertical direction and are discretely dispersed in the scanning direction.

The form of the method for manufacturing a liquid crystal display device of the present invention is not especially limited as long as it essentially includes such components and steps. The method for manufacturing a liquid crystal display device may include other components and steps.

Preferable embodiments of the exposure apparatus and the liquid crystal display device of the present invention are mentioned in more detail below. The following embodiments may be employed in combination.

In the exposure apparatus and the method for manufacturing a liquid crystal display device according to the present invention, preferably the photoalignment film is formed by a material (photoalignment material) in which an alignment direction of liquid crystal changes according to an irradiation direction of a light beam or a moving direction of a light beam irradiation region.

In the exposure apparatus and the method for manufacturing a liquid crystal display device according to the present invention, preferably an aperture ratio of the second region decreases with increasing distance from the first region. Thus, it is possible to inhibit visual recognition of a joint line more effectively.

In the exposure apparatus and the method for manufacturing a liquid crystal display device according to the present invention, the plurality of second transparent portions and the second light-shielding portion may be provided (substantially) symmetrically to each other with respect to a center line of the second region that is parallel to the scanning direction (a center line of the second region that is a line that is parallel to the scanning direction). As a result, an imbalance between the transparent portions and the light-shielding portion can be eliminated across the entire second region, and even when a momentary power interruption occurs, it is possible to prevent a mask end of a joint portion from being visually recognized. Thus, a pattern of the second transparent portions and a pattern of the second light-shielding portion may also be (substantially) symmetrical to each other with respect to the aforementioned center line.

In the exposure apparatus and the method for manufacturing a liquid crystal display device according to the present invention, the plurality of second transparent portions and the second light-shielding portion may be in a (substantially) mirror-image relationship with each other with respect to a center line of the second region that is parallel to the scanning direction (a center line of the second region that is a line that is parallel to the scanning direction). As a result, an imbalance between the transparent portions and the light-shielding portion can be eliminated across the entire second region, and even when a momentary power interruption occurs, it is possible to prevent a mask end of a joint portion from being visually recognized. Thus, a pattern of the second transparent portions and a pattern of the second light-shielding portion may also be in a (substantially) mirror-image relationship with each other with respect to the aforementioned center line.

In the exposure apparatus according to the present invention, preferably: the photomask is a first photomask; the exposure apparatus further includes a second photomask, and exposes the photoalignment film through the first and second photomask while scanning at least one of the light source and the substrate; the second photomask has a third region, and a fourth region that is adjacent to the third region in the vertical direction; the third region has a plurality of third transparent portions inside a third light-shielding portion; the plurality of third transparent portions are arranged in the vertical direction; the fourth region has a plurality of fourth transparent portions inside a fourth light-shielding portion; the plurality of fourth transparent portions are smaller than the plurality of third transparent portions; the plurality of fourth transparent portions are arranged in the vertical direction and are discretely dispersed in the scanning direction; and a part of the photoalignment film is exposed through the plurality of second transparent portions and is also exposed through the plurality of fourth transparent portions. Thus, a joint portion can be exposed through the second and fourth transparent portions, and generation of a joint line at the joint portion can be suppressed. Further, even if scanning temporarily stops during exposure, display unevenness that corresponds to the ends of the fourth transparent portions can be blurred and traces of the pattern of the fourth transparent portions can be made inconspicuous. In this connection, separate light sources may be used for the first and second photomasks.

In the method for manufacturing a liquid crystal display device according to the present invention, preferably: the photomask is a first photomask; in the exposure step, the photoalignment film is exposed through the first photomask and a second photomask while scanning at least one of the light source and the substrate; the second photomask has a third region, and a fourth region that is adjacent to the third region in the vertical direction; the third region has a plurality of third transparent portions inside a third light-shielding portion; the plurality of third transparent portions are arranged in the vertical direction; the fourth region has a plurality of fourth transparent portions inside a fourth light-shielding portion; the plurality of fourth transparent portions are smaller than the plurality of third transparent portions; the plurality of fourth transparent portions are arranged in the vertical direction and are discretely dispersed in the scanning direction; and a part of the photoalignment film is exposed through the plurality of second transparent portions and is also exposed through the plurality of fourth transparent portions. Thus, a joint portion can be exposed through the second and fourth transparent portions, and generation of a joint line at the joint portion can be suppressed. Further, even if scanning temporarily stops during exposure, display unevenness that corresponds to the ends of the fourth transparent portions can be blurred and traces of the pattern of the fourth transparent portions can be made inconspicuous. In this connection, separate light sources may be used for the first and second photomasks.

In the exposure apparatus and the method for manufacturing a liquid crystal display device according to the present invention, preferably an aperture ratio of the fourth region decreases with increasing distance from the third region. Thus, it is possible to inhibit visual recognition of a joint line more effectively.

In the exposure apparatus and the method for manufacturing a liquid crystal display device according to the present invention, the plurality of second transparent portions may be provided in correspondence with the fourth light-shielding portion, and the plurality of fourth transparent portions may be provided in correspondence with the second light-shielding portion. As a result, even when a momentary power interruption occurs, multiple exposures of regions can be prevented, and a situation in which not only a mask end of a joint portion but also a joint exposure part itself is visually recognized can be avoided. Thus, a pattern of the second transparent portions may correspond to a pattern of the fourth light-shielding portion, and a pattern of the fourth transparent portions may correspond to a pattern of the second light-shielding portion.

In the exposure apparatus and the method for manufacturing a liquid crystal display device according to the present invention, the first and second photomasks may be disposed so that a center line of the second region that is parallel to the scanning direction (a center line of the second region that is a line that is parallel to the scanning direction) and a center line of the fourth region that is parallel to the scanning direction (a center line of the fourth region that is a line that is parallel to the scanning direction) (substantially) coincide, and the plurality of second transparent portions and the plurality of fourth transparent portions may be in a (substantially) mirror-image relationship with each other with respect to the two center lines. As a result, even when a momentary power interruption occurs, multiple exposures of regions can be prevented, and a situation in which not only a mask end of a joint portion but also a joint exposure part itself is visually recognized can be avoided. Thus, a pattern of the second transparent portions and a pattern of the fourth transparent portions may be in a (substantially) mirror-image relationship with each other with respect to the aforementioned two center lines.

In the exposure apparatus and the method for manufacturing a liquid crystal display device according to the present invention, when a straight line that is parallel to the scanning direction is taken as a scanning line, (among the plurality of second transparent portions) a plurality of second transparent portions that exist on a same scanning line may be disposed at substantially regular intervals. Thus, the occurrence of display unevenness that is caused by an imbalance with respect to the locations at which the second transparent portions are disposed can be suppressed.

In the exposure apparatus and the method for manufacturing a liquid crystal display device according to the present invention, the plurality of first transparent portions may be discretely dispersed in the scanning direction, and at such time, preferably (among the plurality of first transparent portions) a region between first transparent portions that are adjacent in the scanning direction is shielded from light. Thus, the occurrence of display unevenness that is caused by a discontinuity in the number of edges of the first and second transparent portions can be suppressed.

From a similar viewpoint, in the exposure apparatus and the method for manufacturing a liquid crystal display device according to the present invention, the plurality of third transparent portions may be discretely dispersed in the scanning direction, and at such time, preferably (among the plurality of third transparent portions) a region between third transparent portions that are adjacent in the scanning direction is shielded from light.

In the method for manufacturing a liquid crystal display device according to the present invention, preferably, in the exposure step, the photoalignment film is exposed so that two regions that are exposed in antiparallel directions to each other when the substrate is seen in planar view are formed in each pixel. Thus, a liquid crystal display device having a wide viewing angle such as a liquid crystal display device that adopts a multi-domain TN mode, a multi-domain ECB mode, a multi-domain VAECB mode, a multi-domain VAHAN (vertical alignment hybrid-aligned nematic) mode, or a multi-domain VATN (vertical alignment twisted nematic) mode can be easily realized.

The present invention also provides a liquid crystal display device that is manufactured by the method for manufacturing a liquid crystal display device according to the present invention.

Preferable embodiments of the liquid crystal display device of the present invention are described below in detail. Various embodiments described below may be appropriately combined.

The liquid crystal display device of the present invention is preferably an active matrix liquid crystal display device, although it may be a passive matrix liquid crystal display device.

The liquid crystal display device may include a vertical alignment-type liquid crystal layer, and the liquid crystal layer may contain liquid crystal material with negative dielectric anisotropy. It is thereby possible to realize a liquid crystal display device that adopts a vertical alignment mode.

The liquid crystal display device may include a horizontal alignment-type liquid crystal layer, and the liquid crystal layer may contain liquid crystal material with positive dielectric anisotropy. It is thereby possible to realize a liquid crystal display device that adopts a horizontal alignment mode.

The liquid crystal layer may include twisted nematic liquid crystal. It is thereby possible to realize a liquid crystal display device that adopts a TN mode, a VATN mode, a multi-domain TN mode, or a multi-domain VATN mode. In this connection, a liquid crystal display device that adopts a VATN mode includes a pair of substrates, a liquid crystal layer containing nematic liquid crystal, and a pair of vertical alignment films provided on the respective substrates, wherein, when both substrate surfaces are seen in planar view, directions of aligning treatment that the alignment films have been subjected to are substantially orthogonal to each other, and when a voltage is not applied, the nematic liquid crystal aligns vertically and in a twisted manner.

The aforementioned liquid crystal display device preferably has two or more domains, and preferably has four domains or less, and it is further preferable that the liquid crystal display device has four domains. Thus, complication of the manufacturing process is prevented, and a liquid crystal display device with excellent viewing angle characteristics can be realized. Further, by providing four domains, for example, the viewing angle can be widened in each of four directions that are orthogonal to each other, i.e., the upper, lower, right, and left directions. In addition, the viewing angle characteristics in each of the four directions that are orthogonal to each other can be made substantially uniform. That is, it is possible to realize viewing angle characteristics that have excellent symmetry properties. Consequently, a liquid crystal display device that has little dependence on the viewing angle can be realized. In this connection, the form in which the domains are arranged when domain division into four domains is performed is not particularly limited, and a matrix shape or a shape of horizontal stripes may be mentioned as examples thereof.

Advantageous Effects of Invention

According to the exposure apparatus, the liquid crystal display device and the method for manufacturing a liquid crystal display device of the present invention, even if scanning temporarily stops during a scanning exposure operation, it is possible to inhibit visual recognition of display unevenness at a joint portion.

BRIEF DESCRIPTION OF DRAWINGS

FIG. 4 also shows polarization axis directions of polarizers of Embodiment 1.

FIG. 9 is a planar schematic view that shows the first substrate in the exposure step according to Embodiment 1.

FIG. 10 is a planar schematic view that shows the first substrate and photomasks in the exposure step according to Embodiment 1.

DESCRIPTION OF EMBODIMENTS

Figure 1:
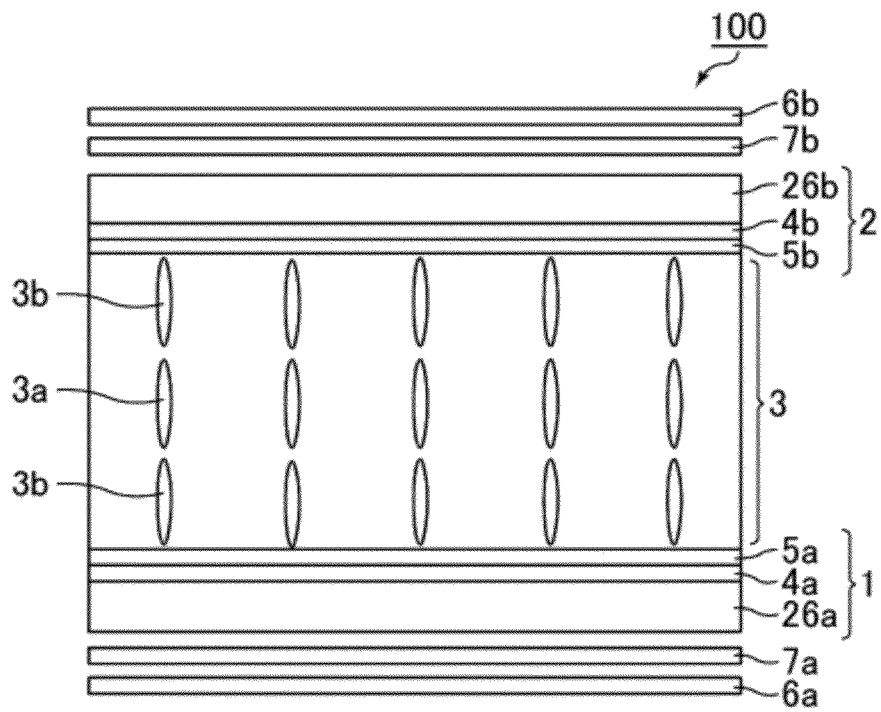
FIG. 1 is a cross-sectional schematic diagram showing a configuration of a liquid crystal display device according to Embodiment 1.

The present invention will be mentioned in more detail referring to the drawings in the following embodiments, but is not limited to these embodiments.

Embodiment 1

First, the configuration of a liquid crystal display device according to Embodiment 1 is described. As shown in FIG. 1, a liquid crystal display device 100 according to the present embodiment has a first substrate 1 (for example, a TFT array substrate) and a second substrate 2 (for example, a CF substrate) as a pair of substrates that face each other, and a liquid crystal layer 3 provided between the first substrate 1 and the second substrate 2. The first substrate 1 includes a transparent electrode 4a (pixel electrode) and a vertical alignment film 5a on a liquid crystal layer 3 side of an insulating substrate 26a in that order from the insulating substrate 26a side. The transparent electrode 4a applies a driving voltage to the liquid crystal layer 3. The second substrate 2 includes a transparent electrode 4b (common electrode) and a vertical alignment film 5b on a liquid crystal layer 3 side of an insulating substrate 26b in that order from the insulating substrate 26b side. The transparent electrode 4b applies a driving voltage to the liquid crystal layer 3. A retardation film 7a and a polarizer 6a are disposed in that order from the substrate side on a side that is opposite to the liquid crystal layer 3 of the first substrate 1. A retardation film 7b and a polarizer 6b are disposed in that order from the substrate side on a side that is opposite to the liquid crystal layer 3 of the second substrate 2. In this connection, although a configuration may be adopted in which the retardation films 7a and 7b are not provided, it is preferable to provide the retardation films 7a and 7b from the viewpoint of realizing a wide viewing angle. A configuration may also be adopted in which only one of the retardation films 7a and 7b is provided. Thus, the liquid crystal display device 100 includes a so-called "liquid crystal display panel".

The liquid crystal layer 3 contains, for example, nematic liquid crystal material with negative dielectric anisotropy (negative nematic liquid crystal material). Liquid crystal molecules in the liquid crystal layer 3 are aligned in a substantially vertical direction with respect to the surfaces of the vertical alignment films 5a and 5b when a driving voltage is not being applied to the liquid crystal layer 3 (when no voltage is applied). In practice, at this time the liquid crystal molecules are aligned at a slight angle of about 0.1 degrees to several degrees with respect to the normal direction of the surfaces of the vertical alignment films 5a and 5b. More specifically, the liquid crystal molecules are aligned by the vertical alignment films 5a and 5b so as to have a slight pretilt angle. In this connection, the term "pretilt angle" refers to an angle formed between a vertical alignment surface and a long axis direction of a liquid crystal molecule that is positioned near the alignment film surface when no voltage is applied. Further, when the substrates are seen in planar view, a direction in which a liquid crystal molecule that is positioned near the alignment film surface tilts during a time that no voltage is applied is defined as a "pretilt direction". On the other hand, when a sufficient driving voltage that is greater than or equal to a certain threshold value is applied to the liquid crystal layer 3 (during voltage application), the liquid crystal molecules are further tilted in a certain direction according to the pretilt angle that has been previously set. More specifically, liquid crystal molecules 3a that are positioned at substantially the center in the thickness direction of the liquid crystal layer 3 are tilted until they are substantially parallel to the surfaces of the first substrate 1 and the second substrate 2. The vertical alignment films 5a and 5b are formed of a photoalignment film material. The pretilt directions that the vertical alignment films 5a and 5b regulate are determined by exposing surfaces of the vertical alignment films 5a and 5b through a photomask, for example, from an oblique direction with respect to the substrate surface.

Domains that are formed inside sub-pixels will now be described using FIGS. 2 to 4. In this connection, in FIGS. 2 and 4, dashed arrows show directions in which a light beam is irradiated onto the first substrate, and in FIGS. 3 and 4, solid arrows show directions in which a light beam is irradiated onto the second substrate. Further, FIG. 4 shows liquid crystal molecules (liquid crystal directors) in a case where the liquid crystal molecules (liquid crystal directors) 3a are positioned at substantially the center of the respective domains and positioned at substantially the center in the thickness direction of the liquid crystal layer when the substrates are seen in planar view.

Figure 2:
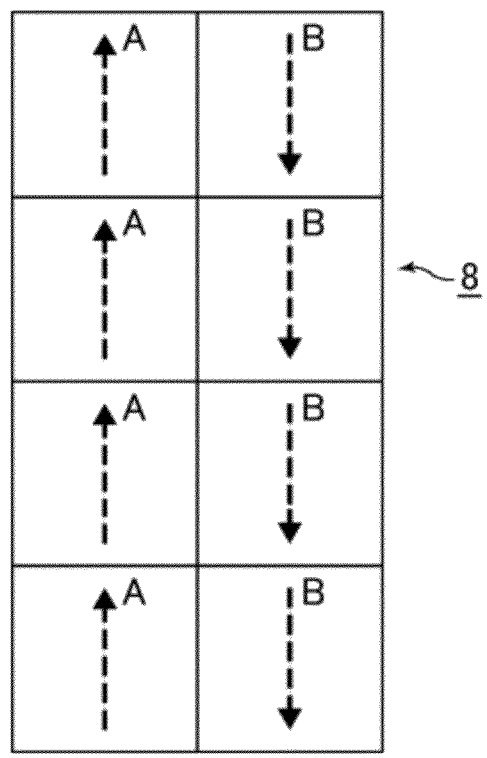
FIG. 2 is a planar schematic view showing one sub-pixel of Embodiment 1, which shows irradiation directions of light with respect to a first substrate (vertical alignment film).
Figure 3:
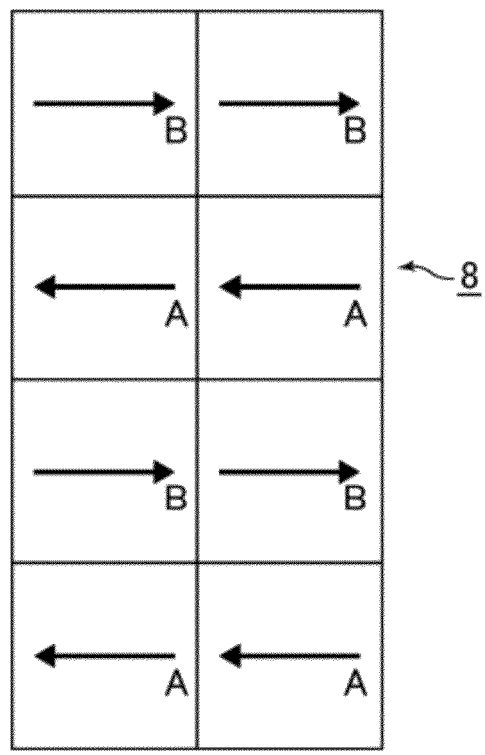
FIG. 3 is a planar schematic view showing one sub-pixel of Embodiment 1, which shows irradiation directions of light with respect to a second substrate (vertical alignment film).

As shown in FIGS. 2 and 3, when the substrates are seen in planar view, the vertical alignment films 5a and 5b are irradiated with light from antiparallel directions (direction A and direction B that are parallel and opposite to each other) within a sub-pixel 8, respectively. Further, as shown in FIG. 4, the irradiation directions of light with respect to the vertical alignment films 5a and 5b are set so as to differ by approximately 90° with respect to each other when the first substrate 1 and the second substrate 2 are attached together. Thus, a pretilt direction which the vertical alignment film 5a regulates and a pretilt direction which the vertical alignment film 5b regulates differ from each other by about 90° in each domain. Accordingly, in each domain, when the substrates are seen in planar view, the liquid crystal molecules contained in the liquid crystal layer 3 are twist-aligned at an angle of approximately 90°. Further, when the substrates are seen in planar view, the liquid crystal molecules 3a are aligned in a direction that deviates by approximately 45° with respect to the irradiation direction of light. In addition, the liquid crystal molecules 3a in the respective domains tilt in four directions that are different to each other. Thus, in the liquid crystal display device 100 of the present embodiment, by using vertical alignment films in which pretilt directions (aligning treatment directions) are orthogonal to each other, the liquid crystal molecules are twist-aligned at an angle of approximately 90°. Accordingly, the liquid crystal display device 100 has a four-domain VATN mode as a liquid crystal mode. Note that although each sub-pixel 8 is divided into eight regions, since there are four tilt directions of the liquid crystal molecules 3a, the liquid crystal display device 100 is referred to as a "four domain-liquid crystal display device".

Figure 4:
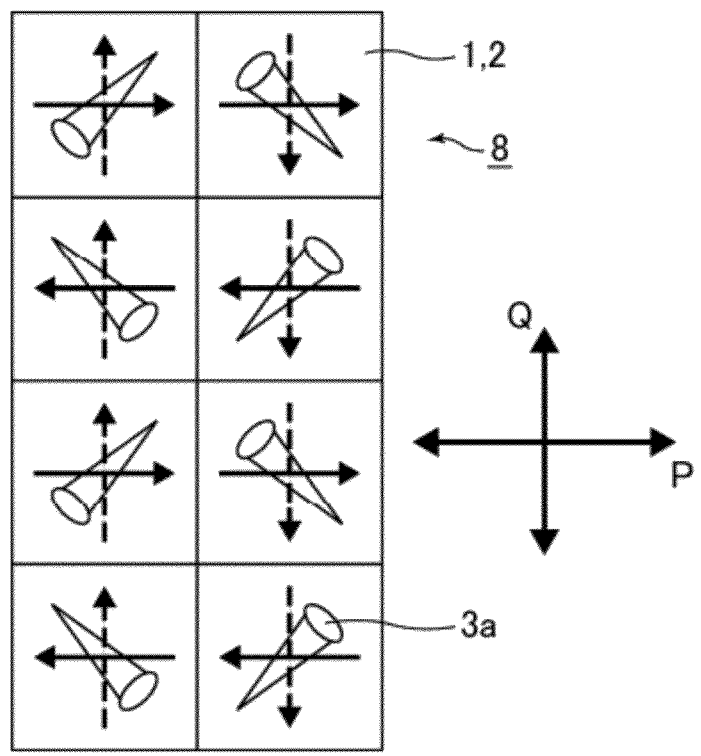
FIG. 4 is a planar schematic view showing one sub-pixel of Embodiment 1, which shows irradiation directions of light with respect to the first and second substrates, and alignment directions of liquid crystal molecules when a voltage is applied.

According to the four-domain VATN mode, as shown in FIGS. 2 to 4, exposure is performed a total of four times by performing exposure twice for each of the first substrate 1 and the second substrate 2, and thus four domains in which the alignment directions of the liquid crystal molecules 3a are different to each other can be formed. Consequently, the number of apparatuses can be reduced and the aligning treatment time (tact time) can be shortened. A form in which one pixel (one sub-pixel) is divided into four domains is also preferable from the viewpoint of achieving a wider viewing angle of the liquid crystal display device. Further, a photomask for forming an alignment control structure such as a rib (protrusion) which is required in a conventional liquid crystal mode that has an alignment control structure, such as an MVA mode, that is, a photolithography process, can be eliminated. As a result, it is possible to simplify the manufacturing process. In this connection, in a case where one pixel (one sub-pixel) is divided into two domains, although a viewing angle can be widened in, for example, one of the vertical direction and the horizontal direction, the viewing angle characteristics in the other direction can not be improved. Further, although the number of domains may be increased to five or more, this is not particularly preferable because the manufacturing process becomes complicated and the treatment time is lengthened. In addition, it is known that, in practice, a particularly noticeable difference does not exist between viewing angle characteristics in a case where one pixel is divided into four domains and a case where one pixel is divided into more than four domains.

As shown in FIG. 4, the polarizers 6a and 6b are disposed so that, when the panel (substrates) is seen in planar view, a polarization axis direction P of the polarizer 6a and a polarization axis direction Q of the polarizer 6b are substantially orthogonal to each other. The polarizers 6a and 6b are disposed so that one of the polarization axis direction P of the polarizer 6a and the polarization axis direction Q of the polarizer 6b is along the irradiation direction of light onto the vertical alignment film 5a, and the other is along the irradiation direction of light onto the vertical alignment film 5b. Accordingly, when a voltage is applied, light incident from the polarizer 6a side is polarized in the polarization axis direction P, is optically rotated by 90° along the twist of the liquid crystal molecules in the liquid crystal layer 3 and turned into polarized light in the polarization axis direction Q and emitted from the polarizer 6b. In contrast, when a voltage is not applied, the liquid crystal molecules in the liquid crystal layer 3 remain vertically aligned, and therefore light that is polarized in the polarization axis direction P passes through the liquid crystal layer 3 without undergoing optical rotation, and is then blocked by the polarizer 6b. Thus, the liquid crystal display device 100 is a liquid crystal display device which operates in a normally black mode. Note that, as used herein, the term "polarization axis" means an absorption axis. Further, the polarization axis direction P of the polarizer 6a and the polarization axis direction Q of the polarizer 6b are not particularly limited to the directions shown in FIG. 4, and may be arbitrarily set. However, it is preferable that the polarization axis directions of the pair of polarizers 6a and 6b are different to each other by approximately 90° when the panel (substrates) is seen in planar view. That is, it is preferable that the polarizers 6a and 6b are disposed in a cross-Nicol relationship.

Although a vertical alignment-type liquid crystal display device is described according to the present embodiment, the liquid crystal display device of the present embodiment may also be a horizontal alignment-type liquid crystal display device. In this case, it is sufficient that the liquid crystal layer 3 contains nematic liquid crystal material with positive dielectric anisotropy (positive nematic liquid crystal material), and instead of the vertical alignment films 5a and 5b, horizontal alignment films are provided on the liquid crystal layer 3 side of the first substrate 1 and the second substrate 2.

Hereunder, a method for manufacturing the liquid crystal display device according to Embodiment 1 is described.

Figure 5:
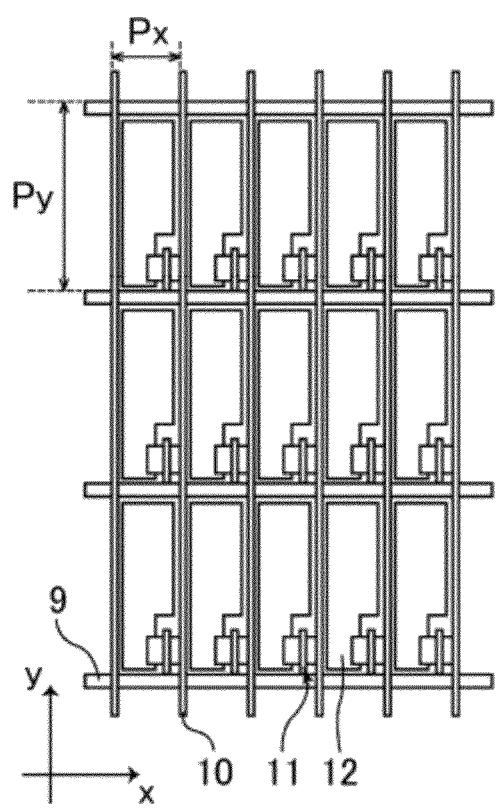
FIG. 5 is a planar schematic view of the first substrate (TFT array substrate) of Embodiment 1.
Figure 6:
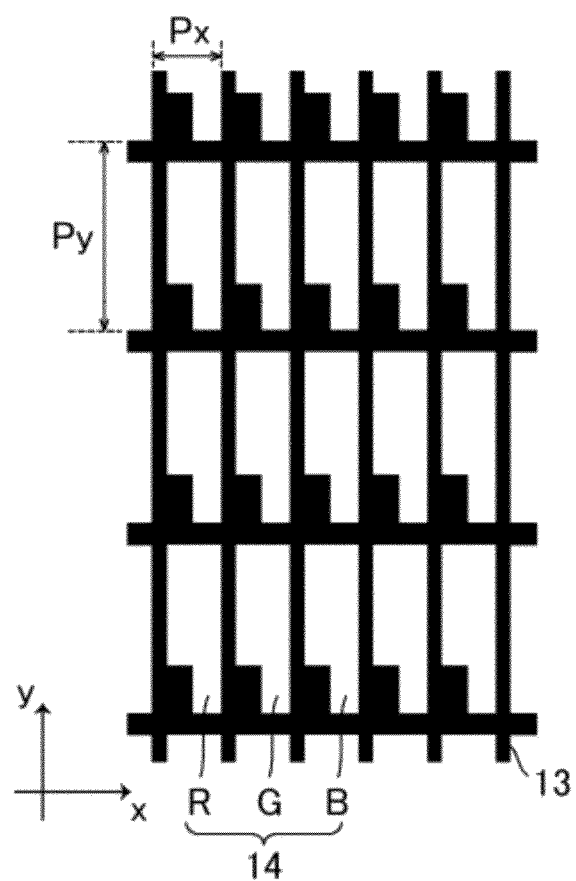
FIG. 6 is a planar schematic view of the second substrate (CF substrate) of Embodiment 1.

First, a common method is used to prepare the pair of substrates, namely, the first substrate 1 and second substrate 2, in a state before alignment films are formed on the substrates. For example, a TFT array substrate that is prepared in the following manner is used as the first substrate. That is, as shown in FIG. 5, on an insulating substrate (not shown) formed from glass or the like, a plurality of scanning signal lines (gate bus lines) 9, a plurality of TFTs 11, a plurality of data signal lines (source bus lines) 10, and a plurality of pixel electrodes 12 are formed in succession so that the scanning signal lines 9 and the data signal lines 10 on the insulating substrate are arranged so as to intersect in a lattice shape with an insulation layer (not shown) therebetween, with one of the TFTs 11 and one of the pixel electrodes 12 being disposed at each point of intersection thereof. On the other hand, for example, a CF substrate that is prepared in the following manner is used as the second substrate. That is, as shown in FIG. 6, a black matrix (BM) 13, a color filter 14 composed of colored layers of three colors, namely, red (R), blue (G), and green (B), a protective film (an overcoat layer; not shown in the drawings), and a transparent electrode film (not shown) are formed in succession on an insulating substrate (not shown) formed from glass or the like so that, as a result, on the insulating substrate, the BM 13 is arranged in a lattice pattern and the color filter 14 is disposed in regions defined by the BM 13. Thus, according to the present embodiment, one pixel is composed of three sub-pixels of RGB that are aligned in the x-axis direction (the lateral direction when the display surface (display screen) is viewed from the front). Note that the material of the insulating substrates is not particularly limited to glass as long as the insulating substrates have a surface with insulating properties. Further, materials that are commonly used may be utilized as the materials of the respective constituent members that are described above.

Subsequently, a solution containing a photoalignment film material is applied to the TFT array substrate and the CF substrate by a spin-casting method or the like. Thereafter, baking of the photoalignment film material is performed, for example, at 180° C. for 60 minutes to form vertical alignment films. A material used as the photoalignment film material is not particularly limited, and a resin or the like containing a photosensitive group may be mentioned as one example thereof. More specifically, a polyimide containing a photosensitive group such as a 4-chalcone group (chemical formula (1) below), a 4'-chalcone group (chemical formula (2) below), a coumarin group (chemical formula (3) below), and a cinnamoyl group (chemical formula (4) below) or the like is suitable. The photosensitive groups represented by the chemical formulae (1) to (4) below undergo a crosslinking reaction (including a dimerization reaction), an isomerization reaction, photo-realignment or the like accompanying irradiation of light (preferably ultraviolet light). If such photosensitive groups are used, variations in the pretilt angles of liquid crystal molecules on the face of the alignment film can be effectively reduced in comparison to a case where a photodecomposition-type photoalignment film material is used. Note that the photosensitive groups represented by the following chemical formulae (1) to (4) also include structures in which a substituent group is bonded to a benzene ring. Further, a cinnamate group ($C_6H_5$—CH=CH—COO; chemical formula (5) below) in which an oxygen atom is further bonded to a carbonyl group in the cinnamoyl group represented by the chemical formula (4) below has the advantage of being easily synthesized. Therefore, a polyimide containing such a cinnamate group is more preferable as the photoalignment film material. The baking temperature, the baking time, and the thickness of the photoalignment film are not particularly limited and may be appropriately set.

[Chem. 1]

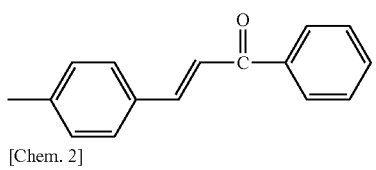

(1)

[Chem. 2]

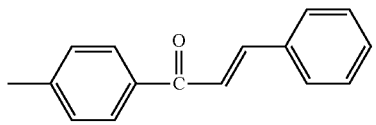

(2)

[Chem. 3]

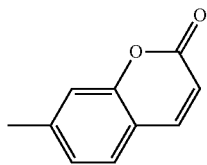

(3)

[Chem. 4]

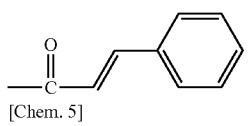

(4)

[Chem. 5]

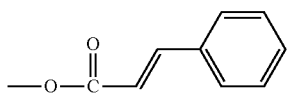

(5)

According to the present embodiment, a photoalignment film material that reacts to light and which causes the liquid crystal molecules to align at a pretilt angle in an irradiation direction of a light beam is used as the alignment film material. However, a photoalignment film material that can regulate a pretilt direction in accordance with a moving direction of an irradiation region of light, as in the photoalignment method described in Non Patent Literature 1, can also be used as the alignment film material. In this case, it is not necessary to make light incident on the substrate from an oblique direction, and light can be made incident on the substrate from a substantially vertical direction.

Next, a method of exposing the alignment films is described.

According to the present embodiment, the alignment films are exposed by a scanning method. Hereunder, an exposure step with respect to the first substrate is described.

First, a photomask 21a having a center portion 19a and a gray tone portion 20a, and a photomask 21b having a center portion 19b and a gray tone portion 20b are prepared.

In this connection, in the photomasks used in the present embodiment, a pattern is formed by a metal film such as a chrome film on a transparent substrate such as a glass substrate, a region in which the metal film is formed is a light-shielding portion, and an opening in the metal film is a transparent portion.

Figure 7:
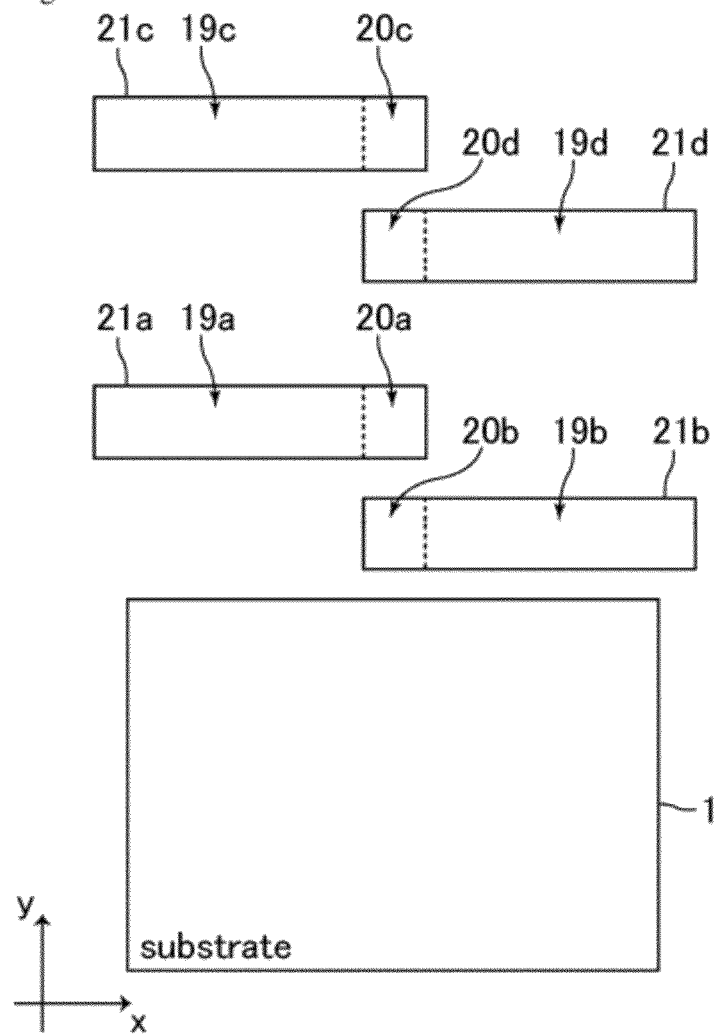
FIG. 7 is a planar schematic view that shows the first substrate and photomasks in an exposure step according to Embodiment 1.

As shown in FIG. 7, the photomasks 21a and 21b are arranged so that the gray tone portions 20a and 20b overlap in the y-axis direction. A plurality of slits that are formed to extend in the y-axis direction are provided in the x-axis (axis forming an angle of 90° with the y axis) direction in the photomasks 21a and 21b. More specifically, a plurality of rectangular transparent portions that have a width that is equal to approximately half of a sub-pixel pitch Px in the x-axis direction (the lateral direction when the display surface is viewed from the front) are provided in light-shielding portions of the center portions 19a and 19b. The transparent portions are arranged at substantially the same pitch as the pitch Px. A plurality of transparent portions are arranged at substantially the same pitch as the pitch Px in the gray tone portions 20a and 20b also. However, the transparent portions in the gray tone portions 20a and 20b are smaller than the transparent portions of the center portions 19a and 19b, and are arranged so as to be dispersed in the scanning direction. The pattern of the gray tone portions 20a and 20b is described in detail later.

A photomask 21c having a center portion 19c and a gray tone portion 20c, and a photomask 21d having a center portion 19d and a gray tone portion 20d are also prepared. As shown in FIG. 7, the photomasks 21c and 21d are arranged so that the gray tone portions 20c and 20d overlap in the y-axis direction. The same pattern as that of the photomasks 21a and 21b is formed on the photomasks 21c and 21d. In this connection, in practice, a space that is large enough to accommodate the first substrate 1 exists between the photomasks 21a and 21b and the photomasks 21c and 21d.

Figure 12:
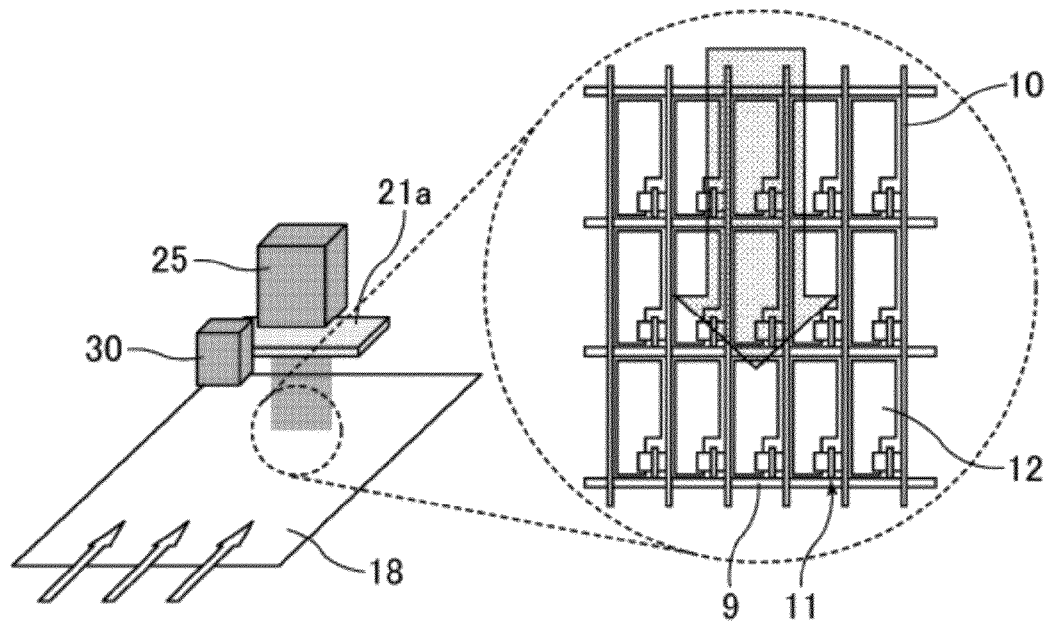
FIG. 12 includes a perspective schematic view that shows an exposure apparatus according to Embodiment 1, and a planar schematic view that shows the configuration of the TFT array substrate according to Embodiment 1.

As shown in FIG. 12, a light source is arranged above each of the photomasks 21a to 21d. Although only a configuration that includes the photomask 21a is illustrated in the FIG. 12, configurations including the photomasks 21b to 21d are the same as the configuration including the photomask 21a. According to the present embodiment, the light source 25 and the photomask 21a are linearly moved in an integrated manner, or a substrate 18 (first substrate or second substrate) is linearly moved while the light source 25 and the photomask 21a remain fixed. FIG. 12 illustrates an example in which the substrate 18 moves, and shows the first substrate (TFT array substrate) as the substrate 18. A camera for image detection 30 is installed at the side of the photomask 21a. The camera scans the bus wiring such as the data signal lines 10 and the scanning signal lines 9, and the substrate 18 can be moved to follow the bus wiring. This process has an advantage that the exposure apparatus can be reduced in size. The cost of the exposure apparatus can also be reduced. Further, since only a small photomask is required, the accuracy of the mask itself can be increased. Further, in the scanning exposure, since the stability of the amount of light that is irradiated onto the substrate surface is excellent, variations in the characteristics of the alignment film such as the alignment orientation and the pretilt angle can be effectively suppressed.

Figure 8:
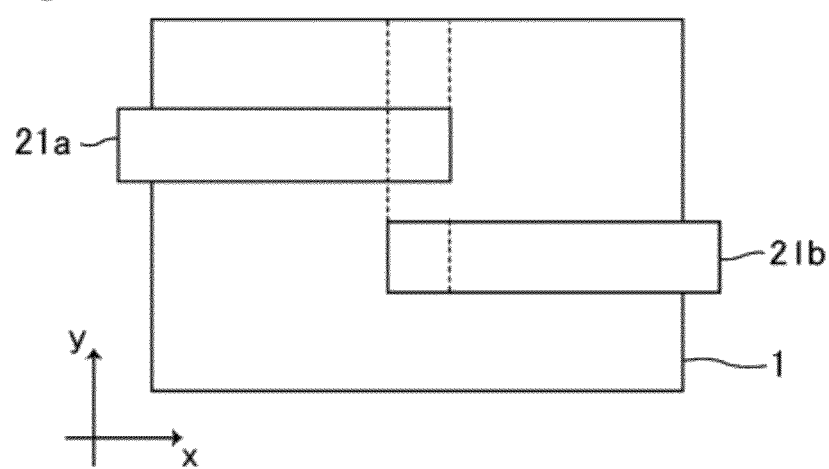
FIG. 8 is a planar schematic view that shows the first substrate and photomasks in the exposure step according to Embodiment 1.
Figure 13:
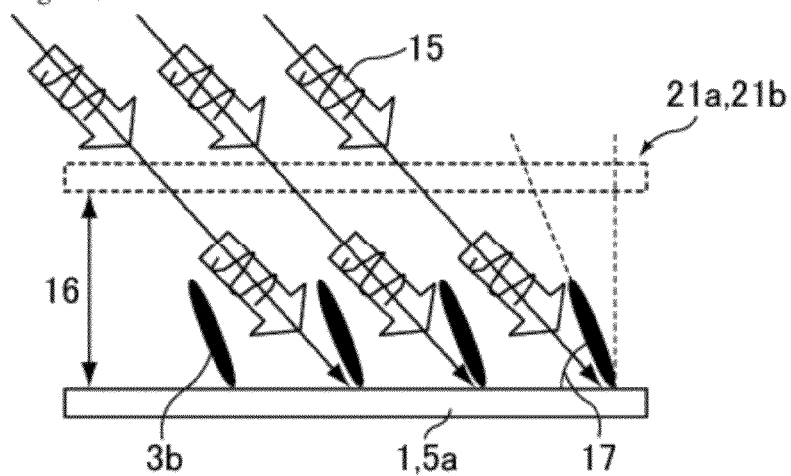
FIG. 13 is a cross-sectional schematic diagram that shows a substrate and photomasks in the exposure step according to Embodiment 1, which illustrates the manner in which light is irradiated onto the substrate.

Next, the slits of the photomasks 21a and 21b and the sub-pixels are aligned. Thereafter, as shown in FIG. 8, the alignment film provided on the surface of the first substrate 1 is exposed from one end to the other end through the photomasks 21a and 21b using polarized ultraviolet light while moving the first substrate 1 in the +y-axis direction (first scan). At this time, the first substrate 1 is moved so that the slits of the photomasks 21a and 21b are positioned along the bus wiring such as the data signal lines 10 and the scanning signal lines 9. As shown in FIG. 13, the first substrate 1 is irradiated with polarized ultraviolet light 15 from an oblique direction. Further, a predetermined interval (a proximity gap 16) is provided between the photomasks 21a and 21b and the first substrate 1. As a result, movement of the first substrate 1 can be performed smoothly, and even if the photomasks 21a and 21b bend under their own weight, contact of the photomasks 21a and 21b with the first substrate 1 can be suppressed. A region of approximately half of each pixel (each sub-pixel) is subjected to aligning treatment by this first scan. Further, as shown in FIG. 13, liquid crystal molecules 3b in the vicinity of the surface of the vertical alignment film 5a exhibit a substantially uniform pretilt angle 17. Furthermore, as shown in FIG. 9, as a result of the first scan, the first substrate 1 has an exposure region 22 that has been subjected to the scanning exposure through the center portion 19a of the photomask 21a, an exposure region 23 that has been subjected to the scanning exposure through the center portion 19b of the photomask 21b, and a joint portion 24 that has been subjected to the scanning exposure through the gray tone portions 20a and 20b of the photomasks 21a and 21b. That is, the exposure step of the present embodiment divides the face of the alignment film that is provided on the first substrate 1 into the exposure regions 22 and 23 and the joint portion 24 that is interposed between the adjacent exposure regions 22 and 23, and exposes the joint portion 24 through the gray tone portions 20a and 20b and exposes the exposure regions 22 and 23 through the center portions 19a and 19b. The joint portion 24 is exposed at least twice through the gray tone portions 20a and 20b.

Figure 11:
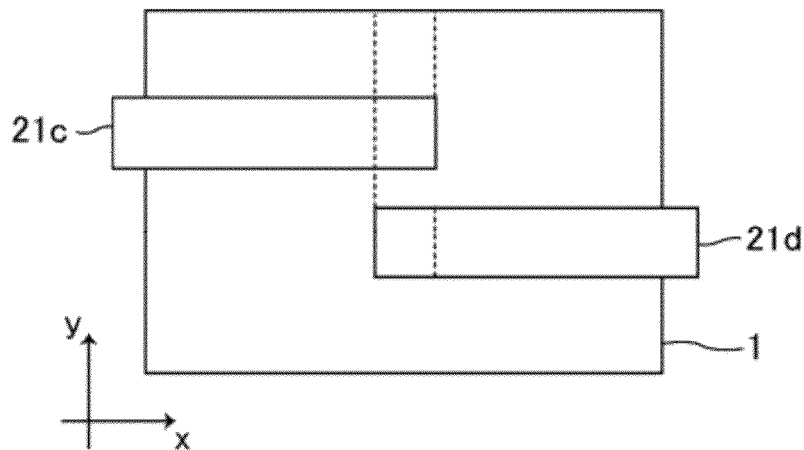
FIG. 11 is a planar schematic view that shows the first substrate and photomasks in the exposure step according to Embodiment 1.

Next, as shown in FIG. 10, the first substrate 1 is rotated in-plane by 180°. Thereafter, the first substrate 1 is horizontally moved by an amount corresponding to approximately half of the pitch Px in the x-axis direction so that each slit provided in the photomasks 21c and 21d corresponds to an unexposed region of each sub-pixel. Next, as shown in FIG. 11, similarly to when performing the first scan as illustrated in FIG. 8, the alignment film is exposed from one end to the other end while moving the first substrate (second scan). As a result, the remaining region of approximately half of each pixel (each sub-pixel) is subjected to aligning treatment so that the first substrate 1 is exposed across the entire surface thereof. Note that an incident angle of the light beam (polarized ultraviolet light 15) with respect to the first substrate 1 during the second scan and the incident angle of the light beam (polarized ultraviolet light 15) with respect to the first substrate 1 during the first scan are substantially the same. In contrast, because the first substrate 1 is rotated in-plane by 180° between the first scan and the second scan, as shown in FIG. 2, when the first substrate 1 is seen in planar view, the direction of the light beam irradiated onto the first substrate 1 during the first scan and the direction of the light beam irradiated onto the first substrate 1 during the second scan are exactly opposite to each other. That is, each sub-pixel of the first substrate 1 undergoes domain division into two regions whose alignment directions are antiparallel to each other.

Next, an exposure step with respect to the second substrate is described. The second substrate is exposed in a substantially similar manner to the first substrate, except that the kinds of photomasks that are utilized are different.

Figure 14:
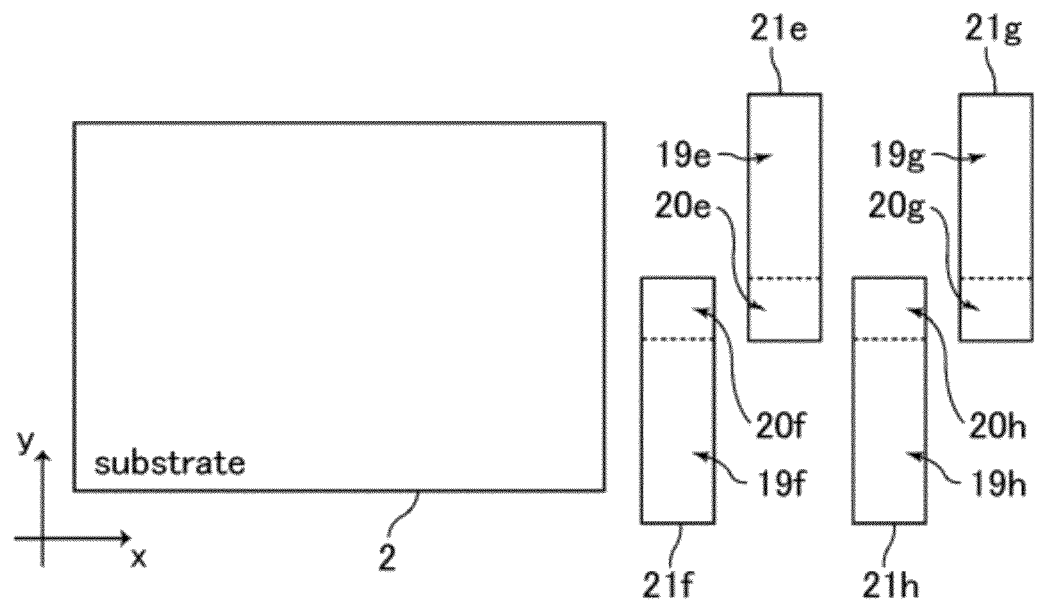
FIG. 14 is a planar schematic view that shows the second substrate and photomasks in the exposure step according to Embodiment 1.

First, a photomask 21e having a center portion 19e and a gray tone portion 20e, and a photomask 21f having a center portion 19f and a gray tone portion 20f are prepared. Subsequently, as shown in FIG. 14, the photomasks 21e and 21f are disposed so that the gray tone portions 20e and 20f overlap in the x-axis direction. A plurality of slits that are formed to extend in the x-axis direction are provided in the y-axis direction in the photomasks 21e and 21f. More specifically, a plurality of rectangular transparent portions that have a width that is equal to approximately ¼ of a pixel pitch Py in the y-axis direction (the vertical direction when the display surface is viewed from the front) are provided in light-shielding portions of the center portions 19e and 19f. The transparent portions are provided so as to be at a pitch that is approximately half of the pitch Py. A plurality of transparent portions are arranged at substantially the same pitch as the pitch Py in the gray tone portions 20e and 20f also. However, the transparent portions in the gray tone portions 20e and 20f are smaller than the transparent portions of the center portions 19e and 19r, and are disposed so as to be dispersed in the scanning direction. In this connection, in the present embodiment, the pixel pitch and the sub-pixel pitch in the vertical direction are the same when the display surface is viewed from the front.

A photomask 21g having a center portion 19g and a gray tone portion 20g, and a photomask 21h having a center portion 19h and a gray tone portion 20h are also prepared. As shown in FIG. 14, the photomasks 21g and 21h are arranged so that the gray tone portions 20g and 20h overlap in the x-axis direction. The same pattern as that of the photomasks 21e and 21f is formed on the photomasks 21g and 21h. In this connection, in practice, a space that is large enough to accommodate the second substrate 2 exists between the photomasks 21e and 21e and the photomasks 21g and 21h.

A light source is arranged above each of the photomasks 21e to 21h similarly to when performing the exposure step with respect to the first substrate as shown in FIG. 12.

Figure 15:
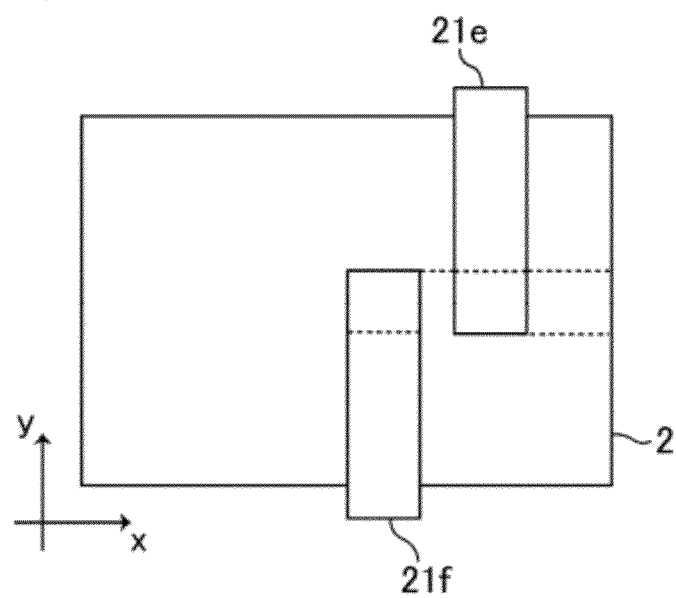
FIG. 15 is a planar schematic view that shows the second substrate and photomasks in the exposure step according to Embodiment 1.
Figure 16:
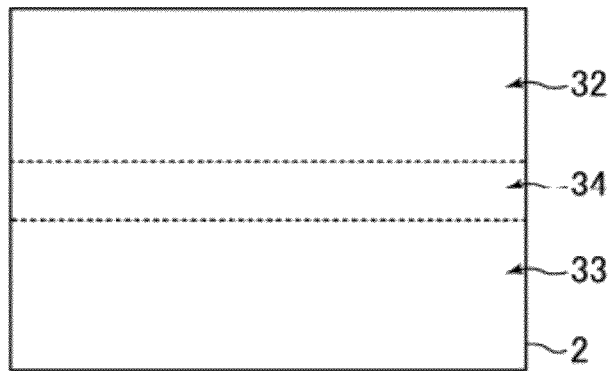
FIG. 16 is a planar schematic view that shows the second substrate in the exposure step according to Embodiment 1.

Next, the slits of the photomasks 21e and 21f and the pixels of the second substrate 2 are aligned. Thereafter, as shown in FIG. 15, the alignment film provided on the surface of the second substrate 2 is exposed from one end to the other end through the photomasks 21e and 21f using polarized ultraviolet light while moving the second substrate 2 in the +x-axis direction (first scan). At this time, the second substrate 2 is moved so that the slits of the photomasks 21e and 21f are positioned along the BM 13. Further, similarly to the irradiation direction with respect to the first substrate that is illustrated in FIG. 13, the second substrate 2 is irradiated with polarized ultraviolet light 15 from an oblique direction. In addition, similarly to the exposure step for the first substrate, a proximity gap is provided between the photomasks 21e and 21f and the second substrate 2. By performing this first scan, a region of approximately half of each pixel (each sub-pixel) is subjected to aligning treatment. Furthermore, liquid crystal molecules in the vicinity of the surface of the vertical alignment film provided on the second substrate exhibit substantially uniform pretilt angles, similarly to the case of the first substrate that is illustrated in FIG. 13. As shown in FIG. 16, as a result of the first scan, the second substrate 2 has an exposure region 32 that has been subjected to the scanning exposure through the center portion 19e of the photomask 21e, an exposure region 33 that has been subjected to the scanning exposure through the center portion 19f of the photomask 21f, and a joint portion 34 that has been subjected to the scanning exposure through the gray tone portions 20e and 20f of the photomasks 21e and 21f. That is, the exposure step of the present embodiment divides the face of the alignment film that is provided on the second substrate 2 into the exposure regions 32 and 33 and the joint portion 34 that is interposed between the adjacent exposure regions 32 and 33, and exposes the joint portion 34 through the gray tone portions 20e and 20f and exposes the exposure regions 32 and 33 through the center portions 19e and 19f. The joint portion 34 is exposed at least twice through the gray tone portions 20e and 20f.

Figure 17:
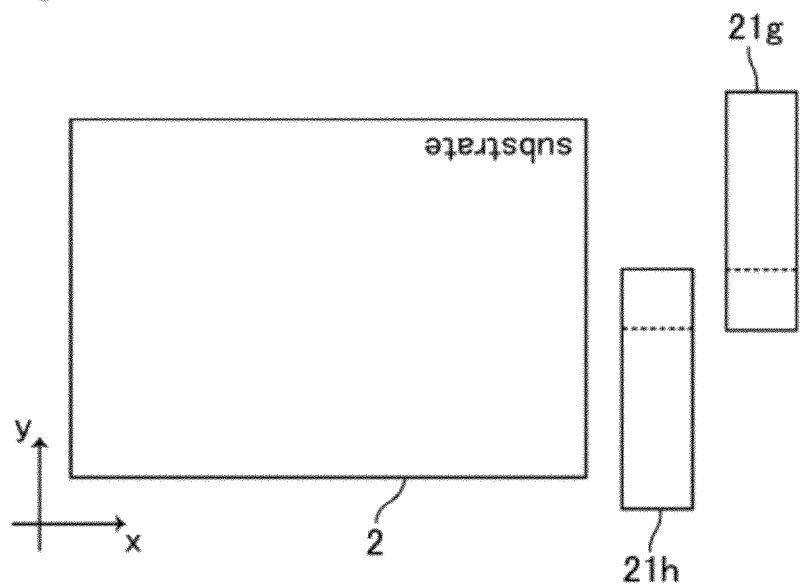
FIG. 17 is a planar schematic view that shows the second substrate and photomasks in the exposure step according to Embodiment 1.
Figure 18:
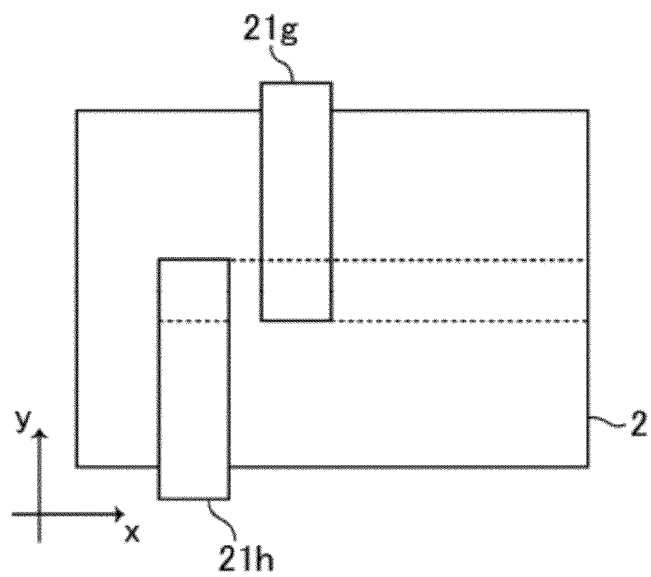
FIG. 18 is a planar schematic view that shows the second substrate and photomasks in the exposure step according to Embodiment 1.

Next, as shown in FIG. 17, the second substrate 2 is rotated in-plane by 180°. Thereafter, the second substrate 2 is horizontally moved by an amount corresponding to approximately ¼ of the pitch Py in the y-axis direction so that each slit provided in the photomasks 21g and 21h corresponds to an unexposed region of each pixel. Next, as shown in FIG. 18, similarly to when performing the first scan as illustrated in FIG. 15, the alignment film is exposed from one end to the other end while moving the second substrate 2 (second scan). As a result, the remaining region of approximately half of each pixel (each sub-pixel) is subjected to aligning treatment so that the second substrate 2 is exposed across the entire surface thereof. Further, as shown in FIG. 3, when the second substrate 2 is seen in planar view, the direction of the light beam irradiated onto the second substrate 2 during the first scan and the direction of the light beam irradiated onto the second substrate 2 during the second scan are exactly opposite to each other. That is, each sub-pixel of the second substrate 2 undergoes domain division into two regions whose alignment directions are antiparallel to each other.

According to the present embodiment, a form is described in which, in order to subject one sub-pixel to domain division into four domains, a TFT array substrate is exposed using a photomask in which a stripe pattern is formed that has a width that is approximately half of the pixel pitch Px in the lateral direction (x-axis direction in FIGS. 5 and 6), and on the other hand, a CF substrate is exposed using a photomask in which a stripe pattern is formed that has a width that is approximately one quarter of the sub-pixel pitch Py in the vertical direction (y-axis direction in FIGS. 5 and 6; note that in the present embodiment the sub-pixel pitch and the pixel pitch in the vertical direction are identical). However, the pattern of the transparent portions is not particularly limited, and may be appropriately set in accordance with the layout of pixels (sub-pixels), the pixel (sub-pixel) size, the resolution of the panel and the like. Further, although four domains are formed in a matrix shape according to the present embodiment, the form in which domains are disposed is not particularly limited to a matrix shape, and may be a shape of horizontal stripes. In addition, if each sub-pixel is further divided into sub-sub-pixels, a slit pattern may be formed in accordance with the respective sub-sub-pixels so as to subject each sub-sub-pixel to domain division.

Examples of materials that can be used with the present embodiment and conditions in a manufacturing process that can be adapted to the present embodiment are mentioned below. However, materials and conditions that can be used with the present embodiment are not limited to the following materials and conditions. Further, the kind of light beam used for exposure is not particularly limited to a polarized ultraviolet light, and the kind of light beam can be appropriately set in accordance with the alignment film material, the manufacturing process and the like, and the light beam may be unpolarized light (extinction ratio=1:1).

Liquid crystal material: nematic liquid crystal in which Δn (birefringence)=0.06 to 0.14, Δ∈ (dielectric anisotropy)=−2.0 to −8.0, and Tni (nematic-isotropic phase transition temperature)=60° C. to 110° C.

Pretilt angle: 85 to 89.9°

Cell thickness: 2 to 5 μm

Irradiation energy density: 0.01 to 5 J/cm²

Proximity gap: 10 to 250 μm

Light source: low pressure mercury lamp, high pressure mercury lamp, heavy hydrogen lamp, metal halide lamp, argon resonance lamp, xenon lamp, excimer laser Extinction ratio of ultraviolet light (degree of polarization): 1:1 to 60:1

Irradiation direction of ultraviolet light: direction at an angle of 0 to 60° from the normal direction of the substrate surface.

Next, the patterns of the photomasks 21a and 21b are described in detail.

Figure 19:
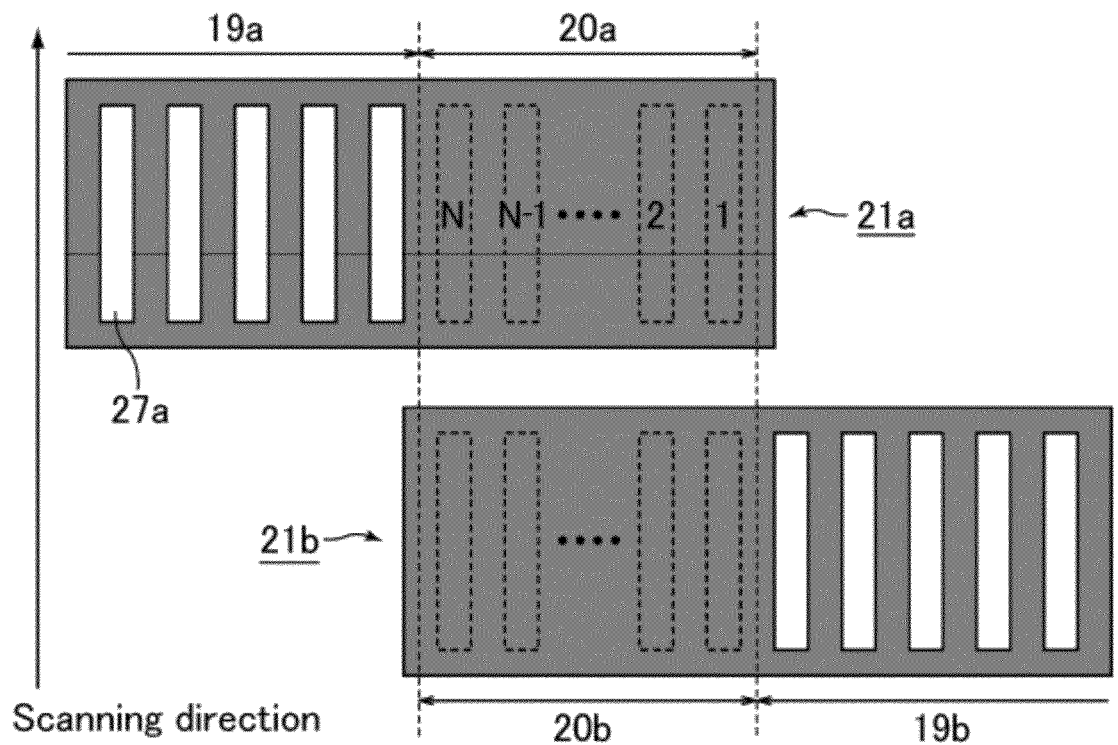
FIG. 19 is a planar schematic view that shows photomasks according to Embodiment 1.

As shown in FIG. 19, the photomask 21a has a center portion 19a and a gray tone portion 20a in which a gray tone is formed. The photomask 21b has a center portion 19b and a gray tone portion 20b in which a gray tone is formed. The gray tone portions 20a and 20b are provided in correspondence with the joint portion 24.

Figure 20:
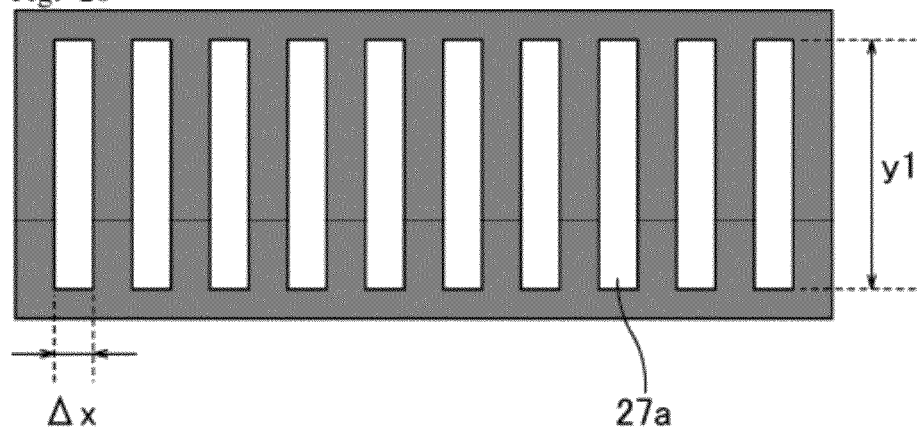
FIG. 20 is a planar schematic view that shows a photomask according to Embodiment 1.

A plurality of transparent portions 27a are formed in the center portion 19a. The planar shape of the transparent portions 27a is a rectangle, and the transparent portions 27a are formed in the shape of stripes. Each transparent portion 27a is the same size. The transparent portions 27a are arranged at the same pitch as the pixel pitch Px in a direction that is orthogonal (vertical direction) to the scanning direction. As shown in FIG. 20, a width of the transparent portions 27a (length in the vertical direction) Δx is, for example, approximately half of the pitch Px. Note that Δx may also be set to a value obtained by adding several μm to a value corresponding to half of the pitch Px. That is, a portion that is exposed a plurality of times may be formed in a boundary between each domain. A length y1 in the scanning direction of the transparent portions 27a is, for example, 40 mm.

Figure 21:
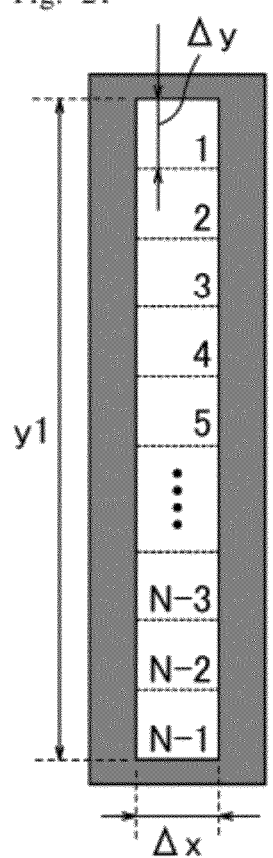
FIG. 21 is a planar schematic view that shows a photomask according to Embodiment 1.

The term "gray tone" refers not to adjusting an aperture ratio using a length of directly connecting transparent portions as in the technology described in Patent Literature 2, but rather to a pattern that adjusts an aperture ratio using the size, number and/or density of a plurality of minute transparent portions. The term "aperture ratio" refers to a proportion (percentage) of the area of each transparent portion of the gray tone portion with respect to the mean area of transparent portions of the center portion. Although a plurality of transparent portions are also formed in the gray tone portion 20a, in this case the aperture ratio changes as a result of a decrease in the size of the transparent portions, a decrease in the number of the transparent portions, and/or a decrease in the density of the transparent portions as the transparent portions approach the end of the mask 21a. If it is assumed that the gray tone portion 20a is provided so as to overlap with pixels of N columns, as shown in FIG. 21, a length obtained, for example, by dividing the length y1 by (N−1) is taken to be a unit length Δy, and a length y2 in a scanning direction of the transparent portions of the gray tone portion 20a is taken to be an integral multiple of Δy. In this connection, a width (length in the vertical direction) of the transparent portions of the gray tone portion 20a is set in the same manner as Δx.

Figure 22:
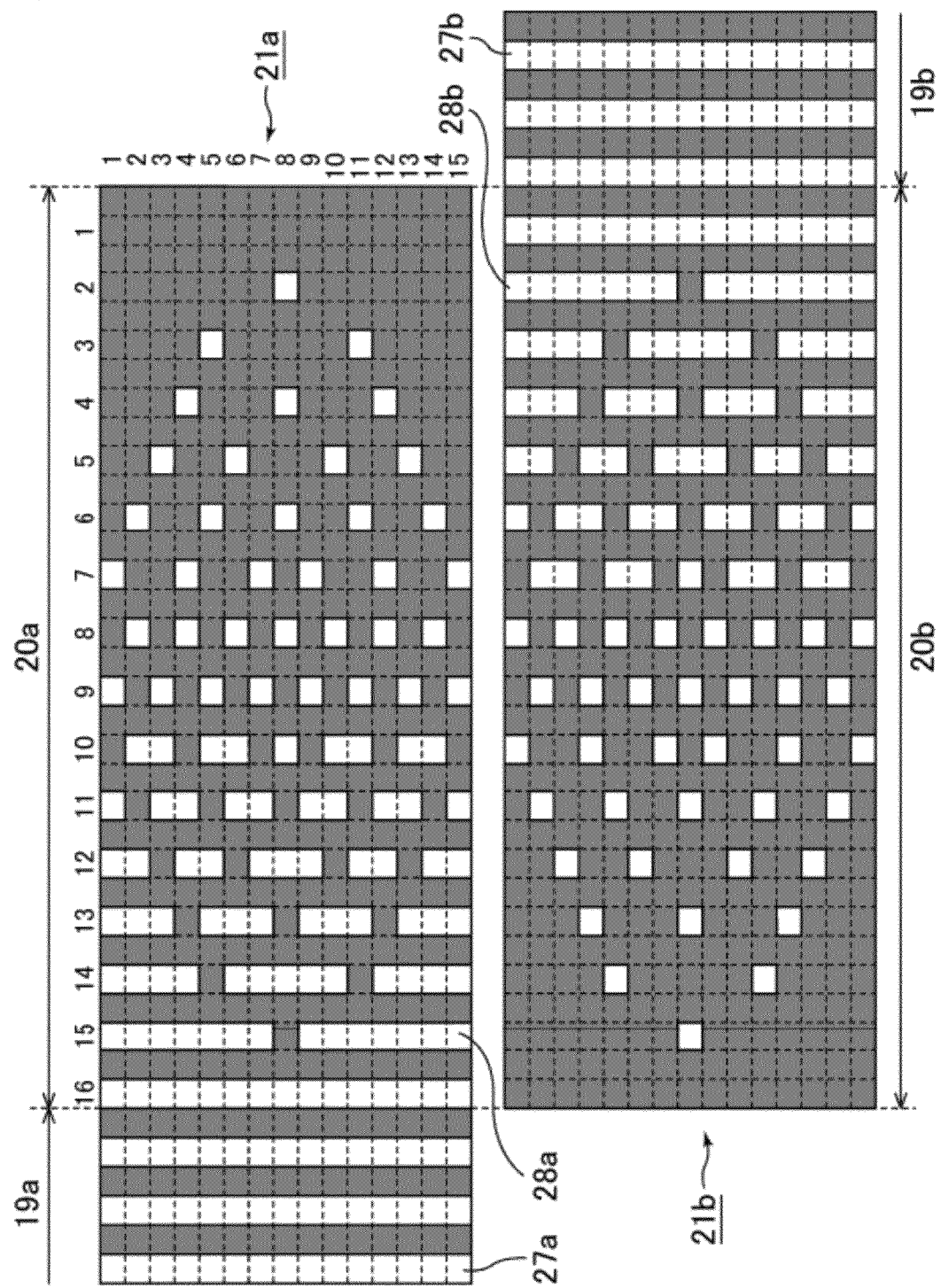
FIG. 22 is a planar schematic view that shows photomasks according to Embodiment 1.

The pattern of the gray tone portion is shown in detail in FIG. 22.

Here, a case in which gray tone portions 20a and 20b are provided so as to overlap with pixels of 16 columns is described as an example. Accordingly, the unit length Δy is a value obtained by dividing 40 mm by 15. Further, a transparent portion that is rectangular in planar view and has a length Δy in the scanning direction and a width Δx is defined as a unit area (in FIG. 22, a region defined by the lattice).

As shown in FIG. 22, in the gray tone portion 20a, a plurality of transparent portions 28a are formed that are smaller than the transparent portions 27a. The planar shape of each transparent portion 28a is a rectangle. The transparent portions 28a are arranged at a pitch that is the same as the pixel pitch Px in the vertical direction. That is, the transparent portions 27a and 28a are all formed in correspondence with pixels (sub-pixels), and are arranged at the pitch Px in the vertical direction. In this case, a pixel positioned at the right end of the gray tone portion 20a is taken as a pixel of a first column, and a pixel positioned at the left end of the gray tone portion 20a is taken as a pixel of a 16th column (refer to the numbers at the top of the gray tone portion 20a in FIG. 22). Further, sequential order is also assigned to the transparent portions 28a in a similar manner to the pixels. That is, the transparent portion 28a that overlaps with a pixel of the second column is taken as a transparent portion of the second column, and a transparent portion 28a that overlaps with a pixel of the 16th column is taken as a transparent portion of the 16th column. Note that a transparent portion is not formed in a part of the gray tone portion 20a that overlaps with a pixel of the first column. Thus, with respect to the transparent portions 28a from the third column to the 15th column, the number of transparent portions 28a in the same column is two or more, and the transparent portions 28a in the same column are arranged so as to be dispersed in the scanning direction. Further, each transparent portion 28a includes one or a plurality of unit areas, and the number of unit areas included in the transparent portions 28a in the same column increases with increasing proximity to the center portion 19a. Specifically, a transparent portion is not formed in a portion that corresponds to pixels of the first column, one unit area is included in the transparent portion 28a of the second column, . . . 14 unit areas are included in the transparent portions 28a of the 15th column, and 15 unit areas are included in the transparent portions 28a of the 16th column. Although the transparent portions 28a up to the ninth column each include a single unit area, several of the transparent portions 28a from the tenth column onwards include a plurality of unit areas. Finally, the transparent portion 28a of the 16th column is the same size as the transparent portions 27a of the center portion 19a. Thus, each transparent portion 27a includes 15 unit areas.

Transparent portions 27b that are the same as the transparent portions 27a are formed in the center portion 19b of the photomask 21b, and transparent portions 28b that are the same as the transparent portions 28a are formed in the gray tone portion 20b of the photomask 21b.

Figure 23:
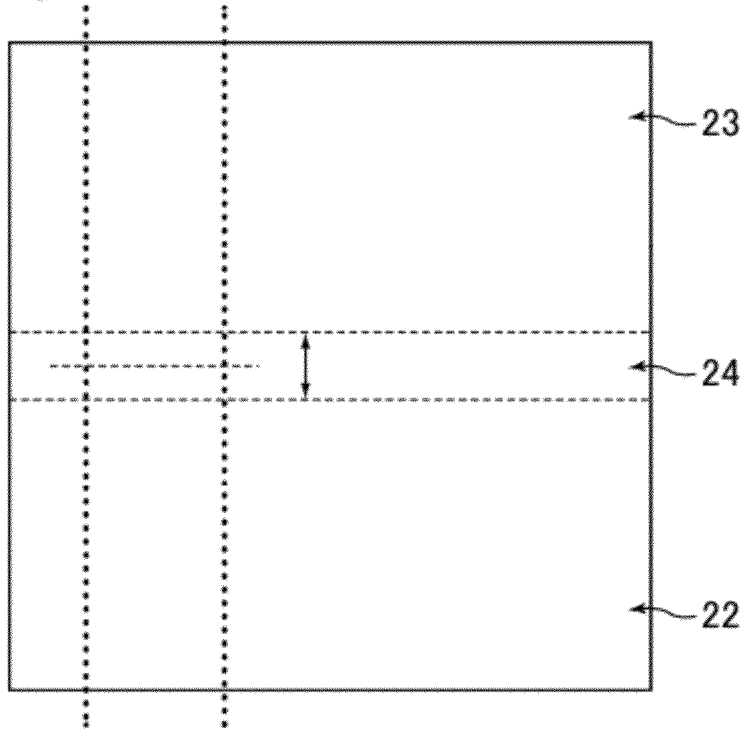
FIG. 23 is a planar schematic view that shows the first substrate according to Embodiment 1.

As described above, a large number of transparent portions 28a and 28b are discretely dispersed in the scanning direction in the photomasks 21a and 21b. Accordingly, even if the first substrate 1 stops during a scanning exposure operation, the patterns of the transparent portions 28a and 28b that are transferred onto the first substrate 1 (alignment film) can be blurred. As a result, as shown in FIG. 23, display unevenness that is attributable to the transparent portions 28a and 28b can be made visually unrecognizable at not only the exposure regions 22 and 23 but also at the joint portion 24.

From the viewpoint of eliminating such display unevenness more effectively, it is preferable to arrange the transparent portions 28a and 28b in the following manner (refer to FIG. 22). First, it is preferable that the transparent portions 28a and 28b are arranged so as to be dispersed as much as possible in the scanning direction. Further, it is preferable that the transparent portions 28a are arranged in a balanced manner so that the pattern of the transparent portions 28a and the pattern of the light-shielding portion in the gray tone portion 20a are inverted with respect to a center line of the gray tone portion 20a that is a center line (joint portion center line) that is parallel to the scanning direction. More specifically, it is preferable that the pattern of the transparent portions 28a and the pattern of the light-shielding portion in the gray tone portion 20a are in a negative/positive relationship or a mirror-image relationship with respect to the joint portion center line. This also applies with respect to the photomask 21b. Further, with respect to the photomask 21b (gray tone portion 20b), it is preferable that the photomask 21b is an exact negative/positive inverted photomask relative to the photomask 21a (gray tone portion 20a). More specifically, it is preferable that the pattern of the transparent portions 28b of the photomask 21b and the pattern of the light-shielding portion in the gray tone portion 20a of the photomask 21a match. Further, it is preferable that the photomask 21a and the photomask 21b are disposed so that their respective joint portion center lines coincide, and that the pattern of the transparent portions 28b of the photomask 21a and the pattern of the transparent portions 28b of the photomask 21b are in a mirror-image relationship with respect to both joint portion center lines.

The transparent portions 28a and 28b are smaller than the transparent portions 27a and 27b, respectively, and the aperture ratio of the gray tone portions 20a and 20b is less than the aperture ratio of the center portions 19a and 19b, respectively. Each pixel that overlaps with the gray tone portions 20a and 20b is exposed through the transparent portions 28a and 28b of the two photomasks 21a and 21b. Accordingly, similarly to the technology described in Patent Literature 2, visual recognition of a joint line can be inhibited.

In addition, the respective aperture ratios of the gray tone portions 20a and 20b gradually decrease with increasing distance from the center portions 19a and 19b. Accordingly, visual recognition of a joint line can be inhibited more effectively.

Further, since the same patterns as those of the photomasks 21a and 21b are formed in the photomasks 21c and 21d, the effects of the patterns of the photomasks 21a and 21b can also be exerted in the photomasks 21c and 21d.

Furthermore, transparent portions that are the same as the transparent portions 27a are formed in the center portions 19e and 19f of the photomasks 21e and 21f, and transparent portions that are the same as the transparent portions 28a are formed in the gray tone portions 20e and 20f of the photomasks 21e and 21f. However, the width of the transparent portions of the photomasks 21e and 21f is approximately ¼ of the pitch Py, and the pitch is approximately half of the pitch Py. In addition, the same patterns as those of the photomasks 21e and 21f are formed in the photomasks 21g and 21h.

Accordingly, even if the second substrate 2 stops during a scanning exposure operation, the patterns of the transparent portions of the gray tone portions 20e and 20f that are transferred onto the second substrate 2 (alignment film) can be blurred. As a result, display unevenness that is attributable to the transparent portions of the gray tone portions 20e and 20f can be made visually unrecognizable at not only the exposure regions 32 and 33 but also at the joint portion 34.

In addition, similarly to the first substrate 1, visual recognition of a joint line can be effectively inhibited.

Figure 24:
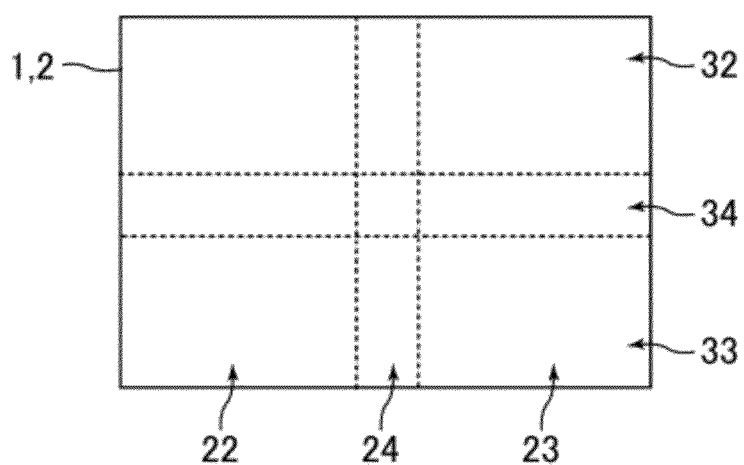
FIG. 24 is a planar schematic view that shows the first substrate and the second substrate that have been attached to each other according to Embodiment 1.

Hereunder, a step of attaching the first substrate and the second substrate together is described. In the attachment step, a sealing member is applied around the circumference of the first substrate or the second substrate that is prepared in the above described manner. Next, plastic beads each having a diameter of, for example, 4 μm are dispersed over the substrate on which the sealing member has been applied, and the first substrate and the second substrate are attached together. At this time, the relationship between the light beam irradiation directions of the two substrates at one sub-pixel is as shown in FIG. 4 so that, in each domain, the scanning directions for the facing substrates are substantially orthogonal to each other. Further, the joint portion 24 of the first substrate 1 and the joint portion 34 of the second substrate 2 are substantially orthogonal as shown in FIG. 24.

Next, when, for example, the above described liquid crystal material is injected between the first substrate and the second substrate, the liquid crystal molecules of each domain exhibit pretilt angles in different directions to each other. As a result, an alignment orientation of liquid crystal molecules 3a in the vicinity of the center in the plane direction and thickness direction of the liquid crystal layer of each domain is, as shown in FIG. 4, a direction that is inclined at an angle of 45° from a direction in which a light beam is irradiated, when the substrate is seen in planar view.

Subsequently, the two polarizers 6a and 6b are attached to the outer sides of the first substrate 1 and the second substrate 2 so that the polarization axes thereof are in the directions shown in FIG. 4. Thus, since the liquid crystal molecules align approximately vertically when a voltage is not applied thereto, the liquid crystal display panel of the present embodiment can realize a favorable black display (normally black mode). Further, since pixels in the liquid crystal display panel of the present embodiment are divided into four domains, and liquid crystal molecules of the four domains respond in four directions that are different to each other, the liquid crystal display panel can exhibit display characteristics that depend little on the viewing angle direction.

Thereafter, after passing through a common module manufacturing process, manufacture of the liquid crystal display device of Embodiment 1 can be completed.

Figure 25:
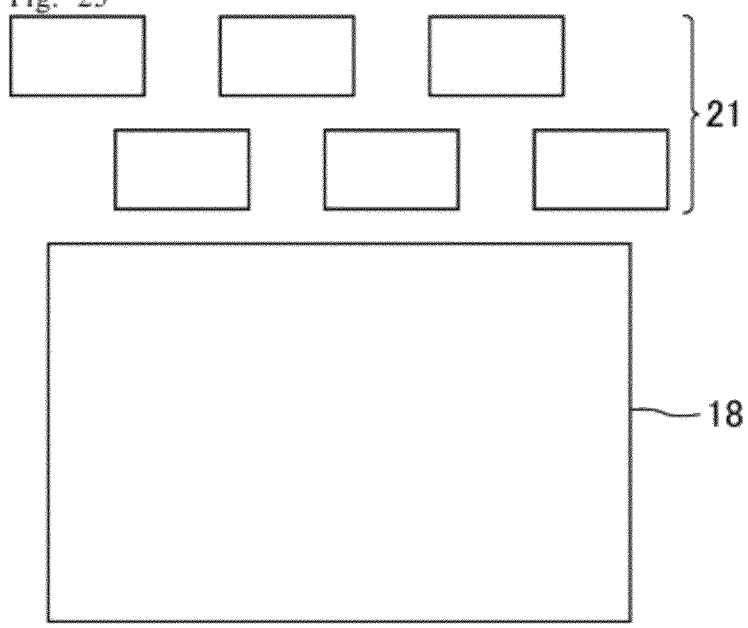
FIG. 25 is a planar schematic view showing a substrate and photomasks in the exposure step according to Embodiment 1, which illustrates a modification example.

Note that, in the present embodiment, the number of photomasks that can be used simultaneously is not limited to two, and may be three or more. For example, as shown in FIG. 25, scanning exposure of the substrate 18 may be performed using six photomasks 21 that are arranged in a staggered manner. As a result, since photomasks of a smaller size can be used, the cost of manufacturing the photomasks can be reduced. In addition, when the mask size is small, deformation of the mask caused by the mask's own weight can be suppressed, and hence aligning treatment can be performed with higher accuracy. Further, when the mask size is small, the pattern accuracy of the mask itself can be improved.

Figure 26:
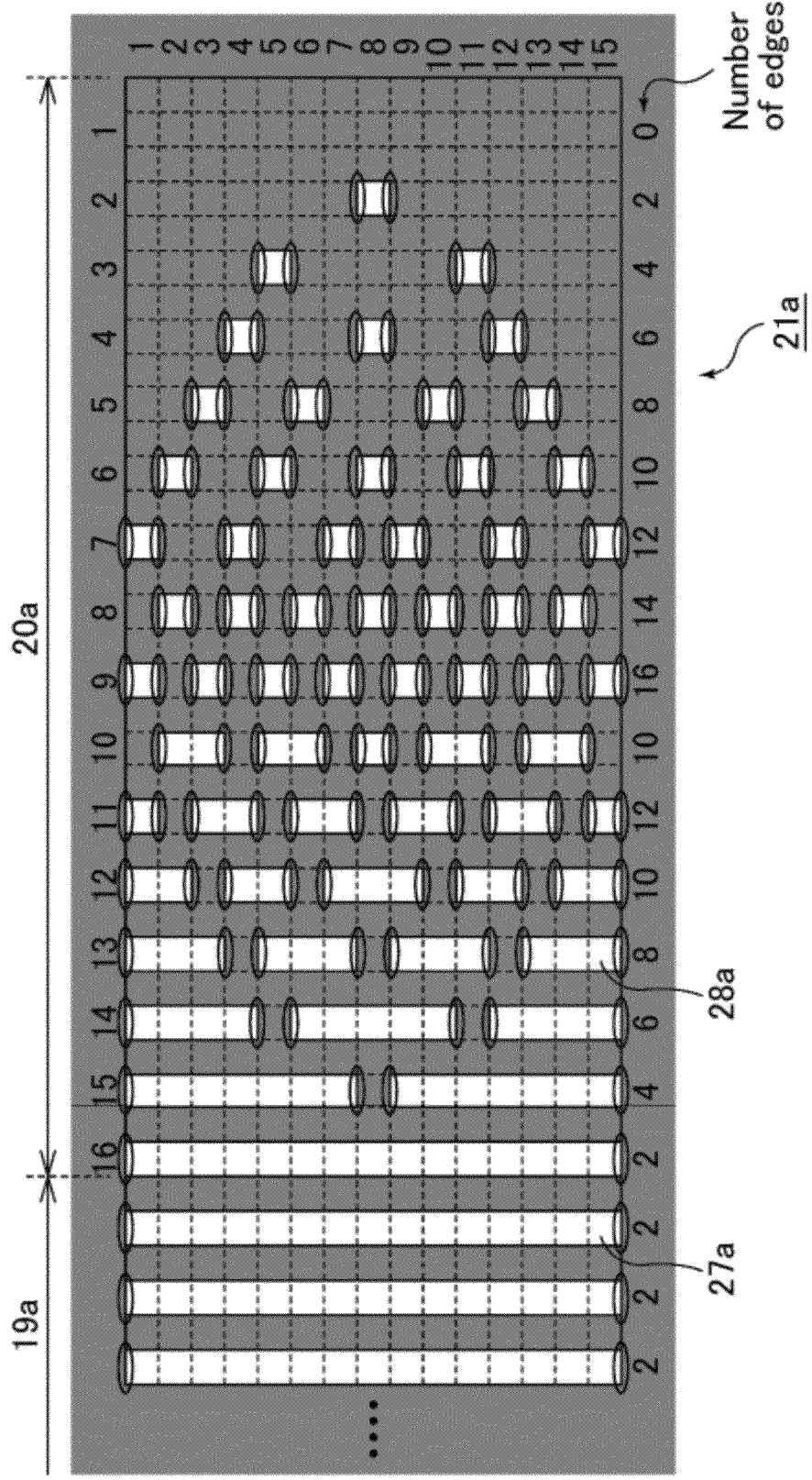
FIG. 26 is a planar schematic view that shows a photomask according to Embodiment 1.

According to the present embodiment the occurrence of display unevenness can be suppressed as described above. However, a point of concern exists with respect to the present embodiment. This point will now be described taking the photomask 21a as an example. The number of edges of the transparent portions in the center portion 19a and gray tone portion 20a that are edges that are orthogonal to the scanning direction is as shown in FIG. 26. FIG. 26 shows that the number of edges is not continuous between the transparent portions 28a from the ninth column to the eleventh column.

Non Patent Literature 1 describes that, even when an alignment film is not exposed from an oblique direction as in the present embodiment, a tilt angle arises even when the alignment film is exposed from the normal direction while scanning. That is, in some cases an alignment capability may be imparted to an alignment film merely by passage of edges of transparent portions. Although Non Patent Literature 1 relates to a horizontal alignment film, it is presumed that the same phenomenon may occur in the case of a vertical alignment film. Consequently, there is a concern that when the gray tone portion 20a is provided as in the present embodiment and a discontinuity occurs with respect to the number of edges in the gray tone portion 20a, a discontinuity will arise in the effective irradiation energy that the alignment film receives, and as a result, the discontinuity in the effective irradiation energy will be visually recognized as unevenness.

The inventors created Embodiment 2 that is described hereunder to eliminate this concern.

Embodiment 2

Figure 27:
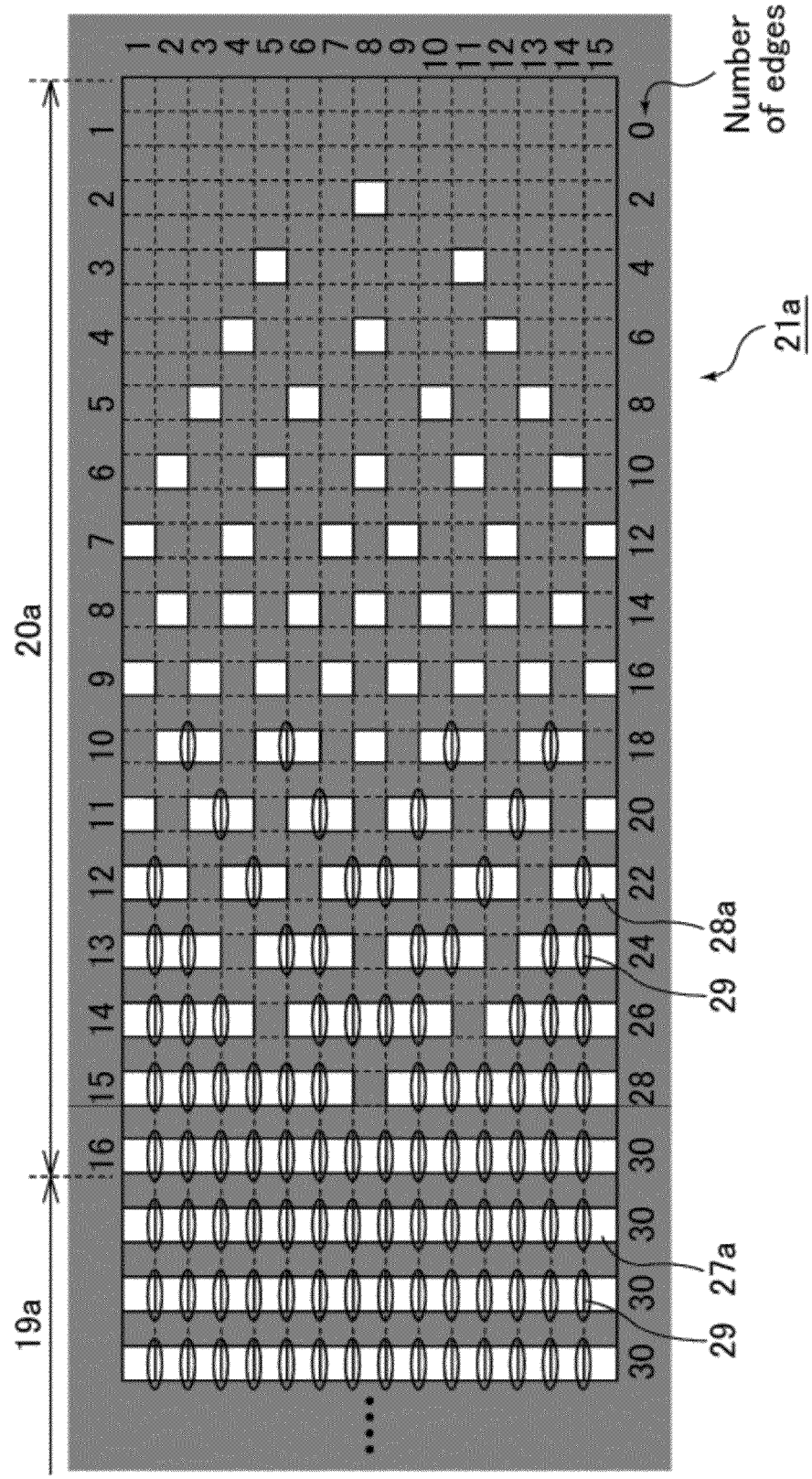
FIG. 27 is a planar schematic view that shows a photomask according to Embodiment 2.

Although the present embodiment is described employing the photomask 21a as an example, a similar configuration may also be adopted with respect to the photomasks 21b to 21g. Embodiment 2 differs from Embodiment 1 in the following respects. That is, as shown in FIG. 27, a light-shielding portion (hereunder, referred to as "bridge 29") is provided at the boundaries of unit areas in both the center portion 19a and the gray tone portion 20a. As a result, the transparent portions 27a are arranged in a discretely dispersed (divided) manner in the scanning direction. In FIG. 27, the edges (edges orthogonal to the scanning direction) of transparent portions that are newly generated as a result of providing the bridges 29 are surrounded by an ellipse. In fact, two edges exist per ellipse. The total number of edges that transparent portions in the same column include is shown at the bottom of the photomask 21a. Thus, according to the present embodiment, the number of edges changes continuously and decreases gradually in the direction from the center portion 19a towards the gray tone portion 20a.

Therefore, according to the present embodiment, the occurrence of unevenness caused by a discontinuity with respect to the number of edges can be suppressed.

Further, since the number of edges increases compared to Embodiment 1, a tilt angle can be generated more effectively. Consequently, the scanning speed can be increased and the tact time can be shortened. Alternatively, the illuminance of the light source can be lowered to extend the life of the light source.

Naturally, according to the present embodiment also, even if the first substrate 1 stops during scanning exposure, display unevenness that is caused by the transparent portions 28a can be made visually unrecognizable not only at the exposure regions 22 and 23, but also at the joint portion 24.

Figure 28:
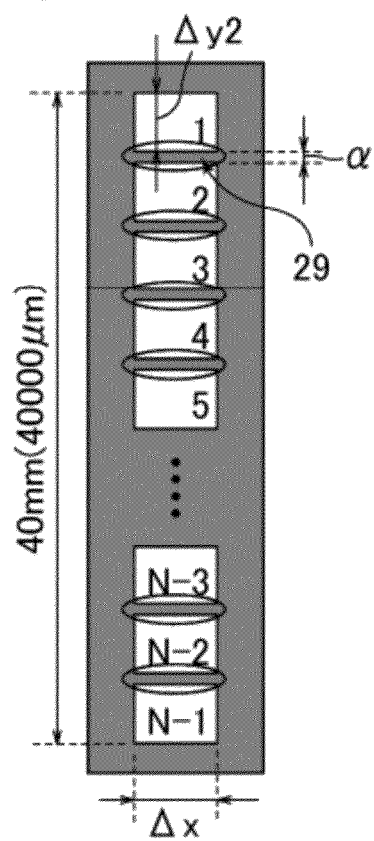
FIG. 28 is a planar schematic view that shows a photomask according to Embodiment 2.

In this connection, preferably a width (length in a short-side direction (scanning direction)) α of the bridge 29 is as thin as possible so that the bridge is not transferred onto the alignment film even if scanning exposure stops. More specifically, preferably a lower limit value of α is 1 μm that is the minimum value of the plotting line width of the mask, and an upper limit value thereof is approximately 20 μm. Since there is a gap (approximately 100 to 200 μm) between the substrate and the mask when performing scanning exposure, light beams that have passed through the transparent portions undergo diffraction. Therefore, the upper limit value is determined so that the intensity distribution on the alignment film of light beams that have passed through the transparent portions is uniform. That is, the upper limit value is determined so that an image of the bridge 29 is sufficiently blurred on the alignment film. Further, as shown in FIG. 28, a length Δy2 (μm) in the scanning direction of a unit area according to the present embodiment is obtained by the following equation.

$$(N-1) \times \Delta y2 + (N-2) \times \alpha = 40000$$

Figure 29:
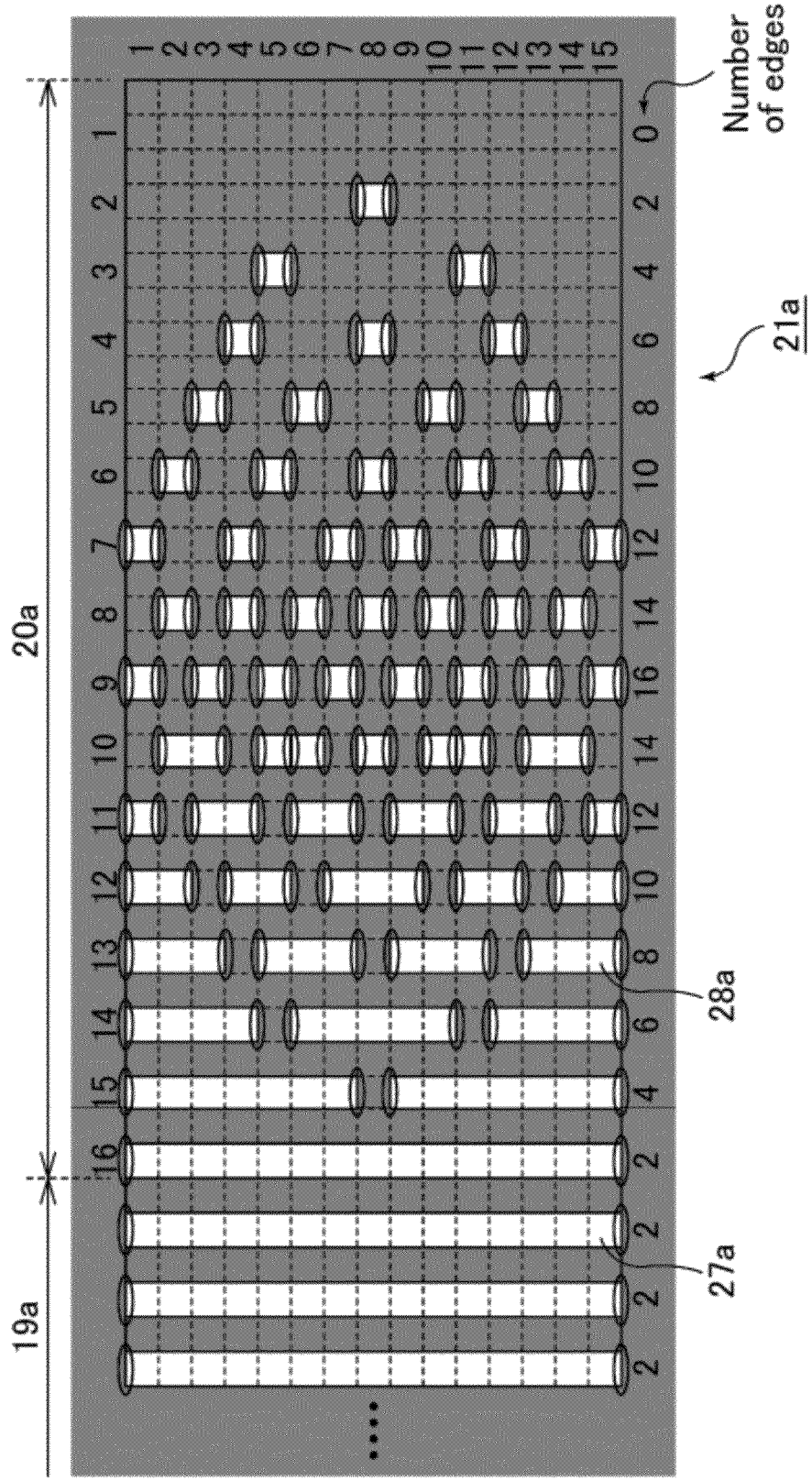
FIG. 29 is a planar schematic view that shows a photomask according to Embodiment 2, which illustrates a modification example.

FIG. 29 shows a modification example of Embodiment 2.

In the present modification example, as shown in FIG. 29, the bridges 29 are only formed with respect to portions at which the number of edges is not continuous in Embodiment 1. That is, according to the present modification example, two bridges 29 are added to the transparent portions 28a of the tenth column only. According to this configuration also, the number of edges in the direction from the center portion 19a towards the gray tone portion 20a can be continuously changed, and hence occurrence of unevenness that is caused by a discontinuity with respect to the number of edges can be suppressed.

Embodiment 3

Figure 30:
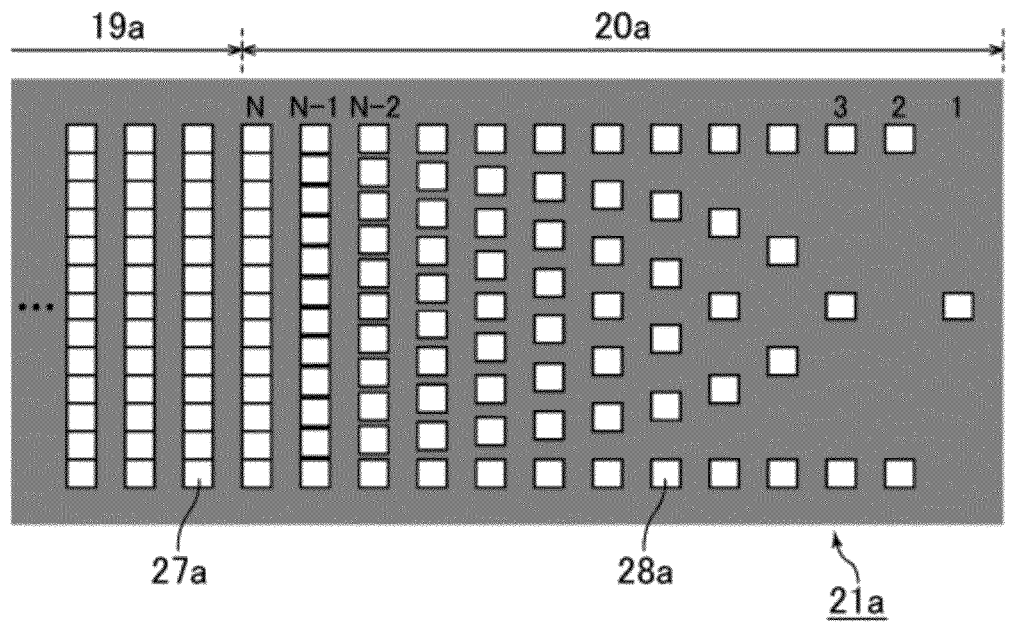
FIG. 30 is a planar schematic view that shows a photomask according to Embodiment 3.

Although the present embodiment is described employing the photomask 21a as an example, a similar configuration may also be adopted with respect to the photomasks 21b to 21g. Embodiment 3 differs from Embodiments 1 and 2 in the following respects. That is, as shown in FIG. 30, a pattern of the photomask of Embodiment 3 is not a mosaic-like pattern as in Embodiments 1 and 2. The gray tone portion 20a is provided so as to overlap with pixels of N columns, and pixels positioned at the right end of the gray tone portion 20a are taken as pixels of a first column, and pixels positioned at the left end of the gray tone portion 20a are taken as pixels of an Nth column (in FIG. 30, refer to the numbers at the top of the gray tone portion 20a). Further, sequential order is also assigned to the transparent portions 28a in a similar manner to the pixels. That is, the transparent portion 28a that overlaps with a pixel of the first column is taken as a transparent portion of the first column, and a transparent portion 28a that overlaps with a pixel of the Nth column is taken as a transparent portion of the Nth column. A straight line that is parallel to the scanning direction is taken as a scanning line. Thus, the number of transparent portions 28a in the same column increases by one per column with increasing proximity to the center portion 19a. Each transparent portion 28a includes one unit area. Among the transparent portions 28a in the third column and thereafter, the transparent portions 28a in the same column, that is, the transparent portions 28a that exist on the same scanning line, are arranged at regular intervals in the scanning direction. Further, in the gray tone portion 20a, the density of the transparent portions 28a changes in a decreasing manner with increasing distance from the center portion 19a.

According to the present embodiment, the transparent portions 28a in the same column are arranged at regular intervals in the scanning direction. Consequently, the positions of the transparent portions 28a are not unbalanced as in the mosaic-like pattern illustrated in Embodiments 1 and 2. Accordingly, the occurrence of display unevenness caused by an imbalance with respect to the positions of the transparent portions 28a can be suppressed.

Figure 31:
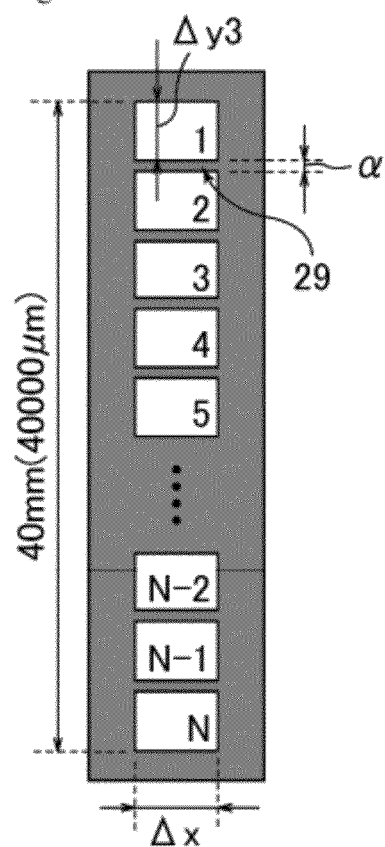
FIG. 31 is a planar schematic view that shows a photomask according to Embodiment 3.
Figure 32:
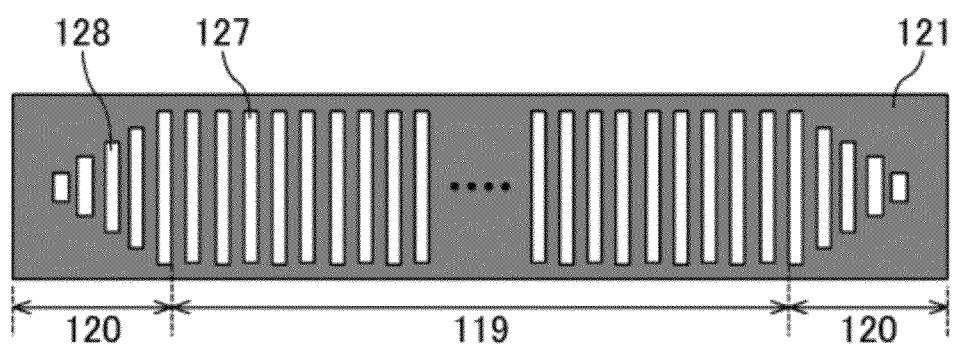
FIG. 32 is a planar schematic view that shows a photomask according to a comparative form.
Figure 33:
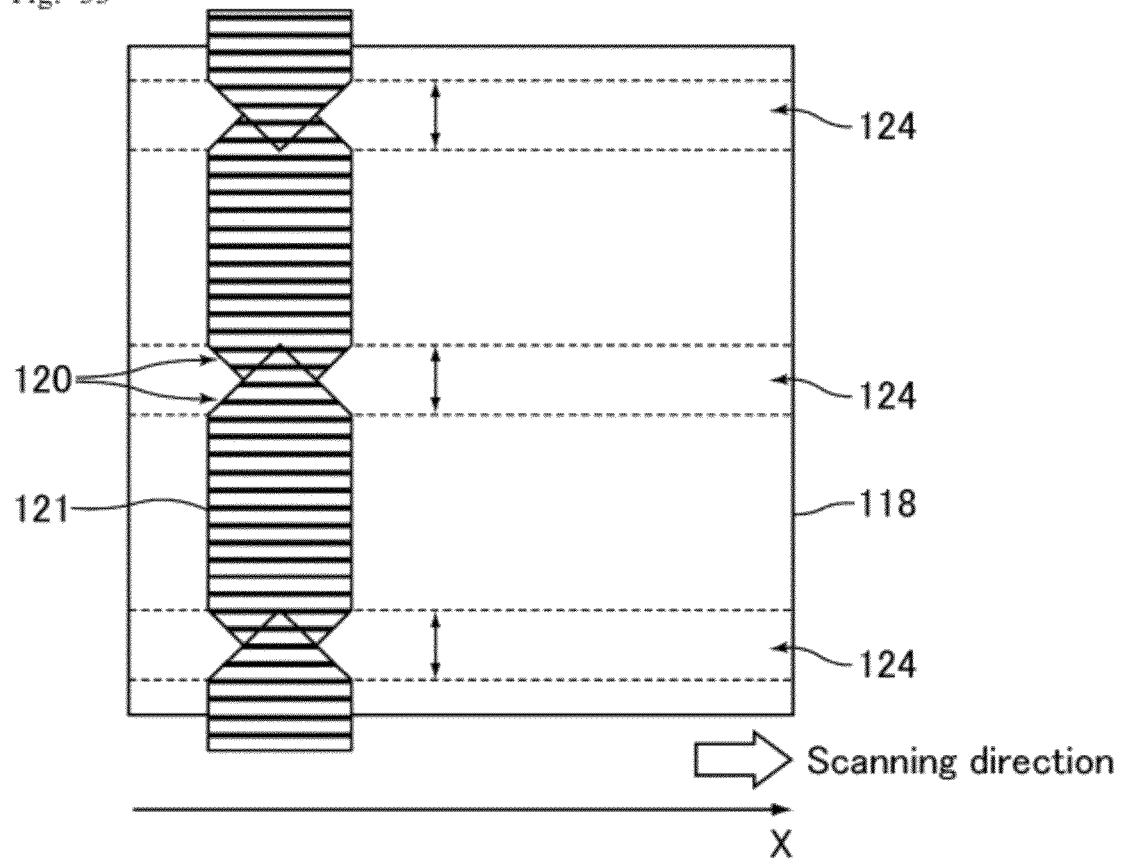
FIG. 33 is a planar schematic view that shows a substrate and photomasks in an exposure step according to the comparative form.
Figure 34:
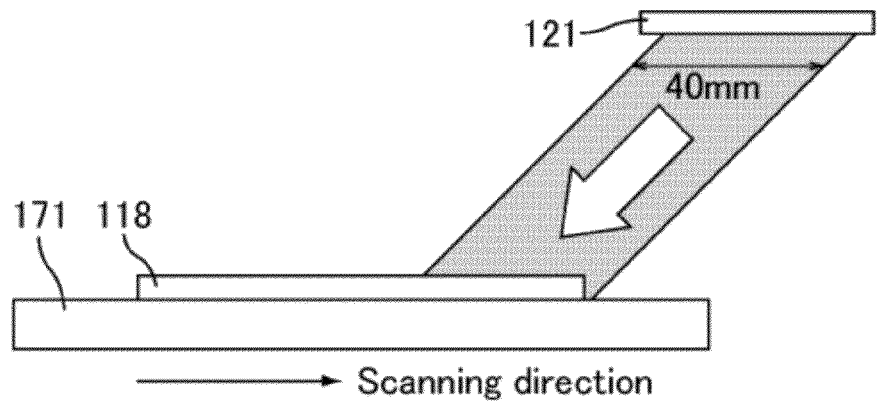
FIG. 34 is a cross-sectional schematic diagram that shows the substrate and a photomask in the exposure step according to the comparative form.
Figure 35:
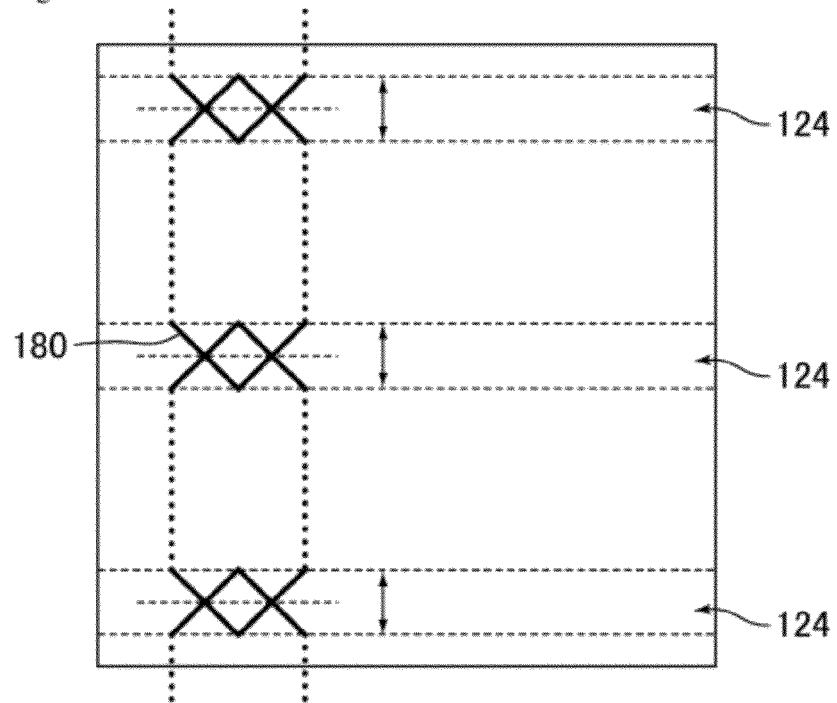
FIG. 35 is a planar schematic view that shows the substrate according to the comparative form.
Figure 36:
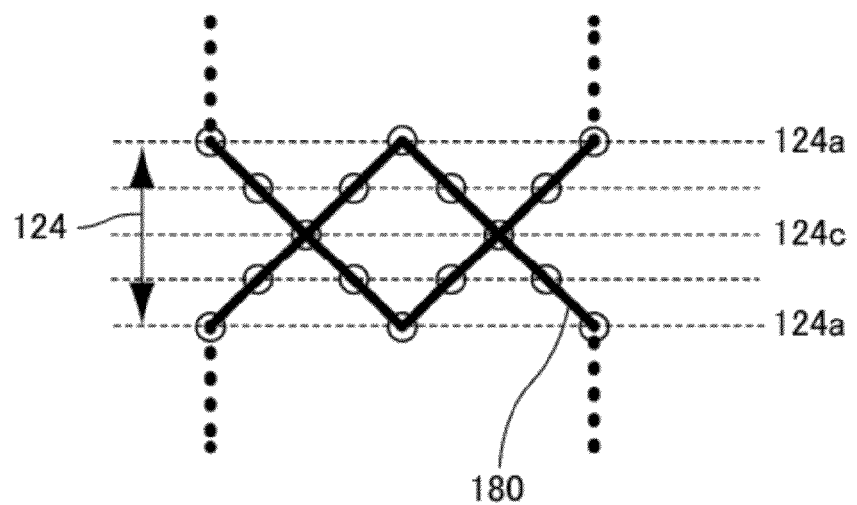
FIG. 36 is a planar schematic view that shows display unevenness according to the comparative form.

Further, since bridges are provided in the transparent portions 27a of the center portion 19a, the number of edges that are orthogonal to the scanning direction changes continuously and decreases gradually in the direction from the center portion 19a towards the gray tone portion 20a. Therefore, according to the present embodiment also, the occurrence of unevenness that is caused by a discontinuity with respect to the number of edges can be suppressed. In this connection, according to the present embodiment, as shown in FIG. 31, a length Δy3 in the scanning direction of a unit area and the width α of the bridge 29 can be determined in the same manner as in Embodiment 2. Naturally, according to the present embodiment also, the bridges 29 need not be provided in the transparent portions 27a.

The present application claims priority to Patent Application No. 2010-13453 filed in Japan on Jan. 25, 2010 under the Paris Convention and provisions of national law in a designated State, the entire contents of which are hereby incorporated by reference.

REFERENCE SIGNS LIST

1: First substrate
2: Second substrate
3: Liquid crystal layer
3a, 3b: Liquid crystal molecule
4a, 4b: Transparent electrode
5a, 5b: Vertical alignment film
6a, 6b: Polarizer
7a, 7b: Retardation film
8: Sub-pixel
9: Scanning signal line
10: Data signal line
11: TFT
12: Pixel electrode
13: Black matrix (BM)
14: Color filter
15: Light beam (polarized ultraviolet light)
16: Proximity gap
17: Pretilt angle
18: Substrate
19a to 19h: Center portion
20a to 20h: Gray tone portion
21, 21a to 21h: Photomask
22, 23, 32, 33: Exposure region
24, 34: Joint portion
25: Light source
26a, 26b: Insulating substrate
27a, 27b, 28a, 28b: Transparent portion
29: Bridge
30: Camera for image detection
100: Liquid crystal display device
P, Q: Polarization axis direction of polarizer
A, B: Direction
R: Red colored layer
G: Green colored layer
B: Blue colored layer

The invention claimed is:

1. An exposure apparatus for exposing a photoalignment film that is provided on a substrate, the exposure apparatus comprising:
a light source and first and second photomasks, and exposing the photoalignment film through the first and second photomasks while scanning at least one of the light source and the substrate,
wherein, when a direction in which at least one of the light source and the substrate is scanned is taken as a scanning direction, and a direction that is orthogonal to the scanning direction is taken as a vertical direction:
the first photomask includes a first region, and a second region that is adjacent to the first region in the vertical direction;
the first region includes a plurality of first transparent portions inside a first light-shielding portion;

the plurality of first transparent portions are arranged in the vertical direction;

the second region includes a plurality of second transparent portions inside a second light-shielding portion;

the plurality of second transparent portions are smaller than the plurality of first transparent portions;

the plurality of second transparent portions are arranged in the vertical direction and are discretely dispersed in the scanning direction;

the second photomask includes a third region, and a fourth region that is adjacent to the third region in the vertical direction;

the third region includes a plurality of third transparent portions inside a third light-shielding portion;

the plurality of third transparent portions are arranged in the vertical direction;

the fourth region includes a plurality of fourth transparent portions inside a fourth light-shielding portion;

the plurality of fourth transparent portions are smaller than the plurality of third transparent portions;

the plurality of fourth transparent portions are arranged in the vertical direction and are discretely dispersed in the scanning direction; and a same part of the photoalignment film is sequentially exposed through the plurality of second and fourth transparent portions that are discretely dispersed in the scanning direction and positioned along one line parallel to the scanning direction in an interleaving pattern.

2. The exposure apparatus according to claim 1,
wherein an aperture ratio of the second region decreases with increasing distance from the first region.

3. The exposure apparatus according to claim 1,
wherein the plurality of second transparent portions and the second light-shielding portion are provided symmetrically to each other with respect to a center line of the second region that is parallel to the scanning direction.

4. The exposure apparatus according to claim 1,
wherein the plurality of second transparent portions and the second light-shielding portion are in a mirror-image relationship with each other with respect to a center line of the second region that is parallel to the scanning direction.

5. The exposure apparatus according to claim 1,
wherein an aperture ratio of the fourth region decreases with increasing distance from the third region.

6. The exposure apparatus according to claim 1,
wherein the plurality of second transparent portions are provided in correspondence with the fourth light-shielding portion; and
the plurality of fourth transparent portions are provided in correspondence with the second light-shielding portion.

7. The exposure apparatus according to claim 1,
wherein the first and second photomasks are disposed so that a center line of the second region that is parallel to the scanning direction, and a center line of the fourth region that is parallel to the scanning direction coincide; and
the plurality of second transparent portions and the plurality of fourth transparent portions are in a mirror-image relationship with each other with respect to the two center lines.

8. The exposure apparatus according to claim 1,
wherein, when a straight line that is parallel to the scanning direction is taken as a scanning line, a plurality of second transparent portions that exist on a same scanning line are disposed at substantially regular intervals.

9. The exposure apparatus according to claim 1,
wherein the plurality of first transparent portions are discretely dispersed in the scanning direction.

10. The exposure apparatus according to claim 9,
wherein a region between first transparent portions that are adjacent in the scanning direction is shielded from light.

11. A method for manufacturing a liquid crystal display device comprising a photoalignment film that is provided on a substrate, the method for manufacturing including:

an exposure step of exposing the photoalignment film through first and second photomasks while scanning at least one of a light source and the substrate, wherein, when a direction in which at least one of the light source and the substrate is scanned is taken as a scanning direction, and a direction that is orthogonal to the scanning direction is taken as a vertical direction:

the first photomask includes a first region, and a second region that is adjacent to the first region in the vertical direction;

the first region includes a plurality of first transparent portions inside a first light-shielding portion;

the plurality of first transparent portions are arranged in the vertical direction;

the second region includes a plurality of second transparent portions inside a second light-shielding portion;

the plurality of second transparent portions are smaller than the plurality of first transparent portions;

the plurality of second transparent portions are arranged in the vertical direction and are discretely dispersed in the scanning direction;

the second photomask includes a third region, and a fourth region that is adjacent to the third region in the vertical direction;

the third region includes a plurality of third transparent portions inside a third light-shielding portion;

the plurality of third transparent portions are arranged in the vertical direction;

the fourth region includes a plurality of fourth transparent portions inside a fourth light-shielding portion;

the plurality of fourth transparent portions are smaller than the plurality of third transparent portions;

the plurality of fourth transparent portions are arranged in the vertical direction and are discretely dispersed in the scanning direction; and a same part of the photoalignment film is sequentially exposed through the plurality of second and fourth transparent portions that are discretely dispersed in the scanning direction and positioned along one line parallel to the scanning direction in an interleaving pattern.

12. The method for manufacturing a liquid crystal display device according to claim 11,
wherein an aperture ratio of the second region decreases with increasing distance from the first region.

13. The method for manufacturing a liquid crystal display device according to claim 11,
wherein the plurality of second transparent portions and the second light-shielding portion are provided symmetrically to each other with respect to a center line of the second region that is parallel to the scanning direction.

14. The method for manufacturing a liquid crystal display device according claim 11,
wherein the plurality of second transparent portions and the second light-shielding portion are in a mirror-image relationship with each other with respect to a center line of the second region that is parallel to the scanning direction.

15. The method for manufacturing a liquid crystal display device according to claim 11,
wherein an aperture ratio of the fourth region decreases with increasing distance from the third region.

16. The method for manufacturing a liquid crystal display device according to claim 11,
wherein the plurality of second transparent portions are provided in correspondence with the fourth light-shielding portion; and
the plurality of fourth transparent portions are provided in correspondence with the second light-shielding portion.

17. The method for manufacturing a liquid crystal display device according to claim 11,
wherein the first and second photomasks are disposed so that a center line of the second region that is parallel to the scanning direction, and a center line of the fourth region that is parallel to the scanning direction coincide; and
the plurality of second transparent portions and the plurality of fourth transparent portions are in a mirror-image relationship with each other with respect to the two center lines.

18. The method for manufacturing a liquid crystal display device according to claim 11,
wherein, when a straight line that is parallel to the scanning direction is taken as a scanning line,
a plurality of second transparent portions that exist on a same scanning line are disposed at substantially regular intervals.

19. The method for manufacturing a liquid crystal display device according to claim 11,
wherein the plurality of first transparent portions are discretely dispersed in the scanning direction.

20. The method for manufacturing a liquid crystal display device according to claim 19,
wherein a region between first transparent portions that are adjacent in the scanning direction is shielded from light.

21. The method for manufacturing a liquid crystal display device according to claim 11,
wherein, in the exposure step, the photoalignment film is exposed so that two regions that are exposed in antiparallel directions to each other when the substrate is seen in planar view are formed in each pixel.

22. A liquid crystal display device that is manufactured by a method for manufacturing a liquid crystal display device according to claim 11.

23. The liquid crystal display device according to claim 22, comprising a vertical alignment-type liquid crystal layer,
wherein the liquid crystal layer contains liquid crystal material with negative dielectric anisotropy.

24. The liquid crystal display device according to claim 22, comprising a horizontal alignment-type liquid crystal layer,
wherein the liquid crystal layer contains liquid crystal material with positive dielectric anisotropy.

25. The liquid crystal display device according to claim 23, wherein the liquid crystal layer contains twisted nematic liquid crystal.

26. The liquid crystal display device according to claim 22, wherein the liquid crystal display device includes two or more domains.

* * * * *